(12) United States Patent
Costa et al.

(10) Patent No.: US 10,615,147 B2
(45) Date of Patent: Apr. 7, 2020

(54) MICROELECTRONICS PACKAGE WITH VERTICALLY STACKED DIES

(71) Applicant: Qorvo US, Inc., Greensboro, NC (US)

(72) Inventors: Julio C. Costa, Oak Ridge, NC (US); Robert Aigner, Ocoee, FL (US); Gernot Fattinger, Sorrento, FL (US); Dirk Robert Walter Leipold, San Jose, CA (US); George Maxim, Saratoga, CA (US); Baker Scott, San Jose, CA (US); Merrill Albert Hatcher, Jr., Greensboro, NC (US); Jon Chadwick, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/004,961

(22) Filed: Jun. 11, 2018

(65) Prior Publication Data

US 2019/0378819 A1 Dec. 12, 2019

(51) Int. Cl.
*H01L 23/522* (2006.01)
*H01L 25/065* (2006.01)
(Continued)

(52) U.S. Cl.
CPC .... *H01L 25/0657* (2013.01); *H01L 21/30604* (2013.01); *H01L 21/563* (2013.01);
(Continued)

(58) Field of Classification Search
CPC ............ H01L 25/0652; H01L 25/0756; H01L 25/0657; H01L 25/071; H01L 25/112; H01L 25/117; H01L 25/043; H01L 25/074
See application file for complete search history.

(56) References Cited

U.S. PATENT DOCUMENTS 4,093,562 A  6/1978  Kishimoto
4,366,202 A  12/1982  Borovsky
(Continued)

FOREIGN PATENT DOCUMENTS

CN  103811474 A  5/2014
CN  103872012 A  6/2014
(Continued)

OTHER PUBLICATIONS

Non-Final Office Action for U.S. Appl. No. 15/676,693, dated May 3, 2018, 14 pages.
(Continued)

*Primary Examiner* — Dale E Page
*Assistant Examiner* — Wilner Jean Baptiste
(74) *Attorney, Agent, or Firm* — Withrow & Terranova, P.L.L.C.

(57) ABSTRACT

The present disclosure relates to a microelectronics package with vertically stacked flip-chip dies, and a process for making the same. The disclosed microelectronics package includes a module board, a first thinned flip-chip die with a through-die via, a second flip-chip die with a package contact at the bottom, and a mold compound. Herein, a top portion of the through-die via is exposed at top of the first thinned flip-chip die. The first thinned flip-chip die and the mold compound reside over the module substrate. The mold compound surrounds the first thinned flip-chip die and extends above the first thinned flip-chip die to define an opening. The second flip-chip die, which has a smaller plane size than the first thinned flip-chip die, resides within the opening and is stacked with the first thinned flip-chip die by coupling the package contact to the exposed top portion of the through-die via.

22 Claims, 24 Drawing Sheets

(51) Int. Cl.
*H01L 23/31* (2006.01)
*H01L 21/768* (2006.01)
*H01L 21/306* (2006.01)
*H01L 23/00* (2006.01)
*H01L 25/00* (2006.01)
*H01L 21/56* (2006.01)

(52) U.S. Cl.
CPC ...... *H01L 21/565* (2013.01); *H01L 21/76898* (2013.01); *H01L 23/3121* (2013.01); *H01L 23/3135* (2013.01); *H01L 24/03* (2013.01); *H01L 24/11* (2013.01); *H01L 24/81* (2013.01); *H01L 25/50* (2013.01); *H01L 24/05* (2013.01); *H01L 24/16* (2013.01); *H01L 2224/0231* (2013.01); *H01L 2224/02372* (2013.01); *H01L 2224/02373* (2013.01); *H01L 2224/0401* (2013.01); *H01L 2224/05569* (2013.01); *H01L 2224/05573* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2225/06562* (2013.01); *H01L 2225/06568* (2013.01); *H01L 2225/06582* (2013.01); *H01L 2225/06589* (2013.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |

(56) References Cited

U.S. PATENT DOCUMENTS

| | | |
|---|---|---|
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1* | 12/2016 | Yu ..................... B81C 1/00238 |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0207350 A1 | 7/2017 | Leipold et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0138082 A1 | 5/2018 | Costa et al. |
| 2018/0145678 A1 | 5/2018 | Maxim et al. |
| 2018/0166358 A1 | 6/2018 | Costa et al. |
| 2019/0013254 A1 | 1/2019 | Costa et al. |
| 2019/0013255 A1 | 1/2019 | Costa et al. |
| 2019/0074263 A1 | 3/2019 | Costa et al. |
| 2019/0074271 A1 | 3/2019 | Costa et al. |
| 2019/0172842 A1 | 6/2019 | Whitefield |
| 2019/0189599 A1 | 6/2019 | Baloglu et al. |

FOREIGN PATENT DOCUMENTS

| | | |
|---|---|---|
| EP | 2996143 A1 | 3/2016 |
| JP | S505733 Y1 | 2/1975 |
| JP | H11220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |

OTHER PUBLICATIONS

Notice of Allowance for U.S. Appl. No. 15/789,107, dated May 18, 2018, 8 pages.

Final Office Action for U.S. Appl. No. 15/616,109, dated Apr. 19, 2018, 18 pages.

Notice of Allowance for U.S. Appl. No. 15/676,693, dated Jul. 20, 2018, 8 pages.

Notice of Allowance for U.S. Appl. No. 15/695,629, dated Jul. 11, 2018, 12 pages.

Notice of Allowance for U.S. Appl. No. 15/387,855, dated Aug. 10, 2018, 7 pages.

Notice of Allowance for U.S. Appl. No. 15/914,538, dated Aug. 1, 2018, 9 pages.

Notice of Allowance and Applicant-Initiated Interview Summary for U.S. Appl. No. 15/262,457, dated Sep. 28, 2018, 16 pages.

(56) References Cited

OTHER PUBLICATIONS

Corrected Notice of Allowance for U.S. Appl. No. 15/676,693, dated Aug. 29, 2018, 5 pages.
Final Office Action for U.S. Appl. No. 15/601,858, dated Nov. 26, 2018, 16 pages.
Non-Final Office Action for U.S. Appl. No. 15/945,418, dated Nov. 1, 2018, 13 pages.
First Office Action for Chinese Patent Application No. 201510746323.X, dated Nov. 2, 2018, 12 pages.
Advisory Action for U.S. Appl. No. 15/601,858, dated Jan. 22, 2019, 3 pages.
Notice of Allowance for U.S. Appl. No. 16/038,879, dated Jan. 9, 2019, 8 pages.
Notice of Allowance for U.S. Appl. No. 16/004,961, dated Jan. 11, 2019, 8 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Non-Final Office Action for U.S. Appl. No. 15/992,613, dated Feb. 27, 2019, 15 pages.
Non-Final Office Action for U.S. Appl. No. 15/695,579, dated Jan. 28, 2019, 8 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.

Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.

(56) References Cited

OTHER PUBLICATIONS

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.

(56) References Cited

OTHER PUBLICATIONS

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, Mar. 1, 2001 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/601,858, dated Apr. 17, 2019, 9 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Notice of Reasons for Refusal for Japanese Patent Application No. 2015-180657, dated Jul. 9, 2019, 4 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical

(56) References Cited

OTHER PUBLICATIONS

Conference on RF/Microwave Power Amplifiers for Radio and Wireless Applications, 2017, pp. 88-91.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Tsai, Chun-Lin, et al., "Smart GaN platform; Performance & Challenges," IEEE International Electron Devices Meeting, 2017, 4 pages.
Notice of Allowance for U.S. Appl. No. 15/601,858, dated Aug. 16, 2019, 8 pages.
International Search Report and Written Opinion for International Patent Application No. PCT/US19/25591, dated Jun. 21, 2019, 7 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Office Action for Japanese Patent Application No. 2018-526613, dated Nov. 5, 2019, 8 pages.

\* cited by examiner

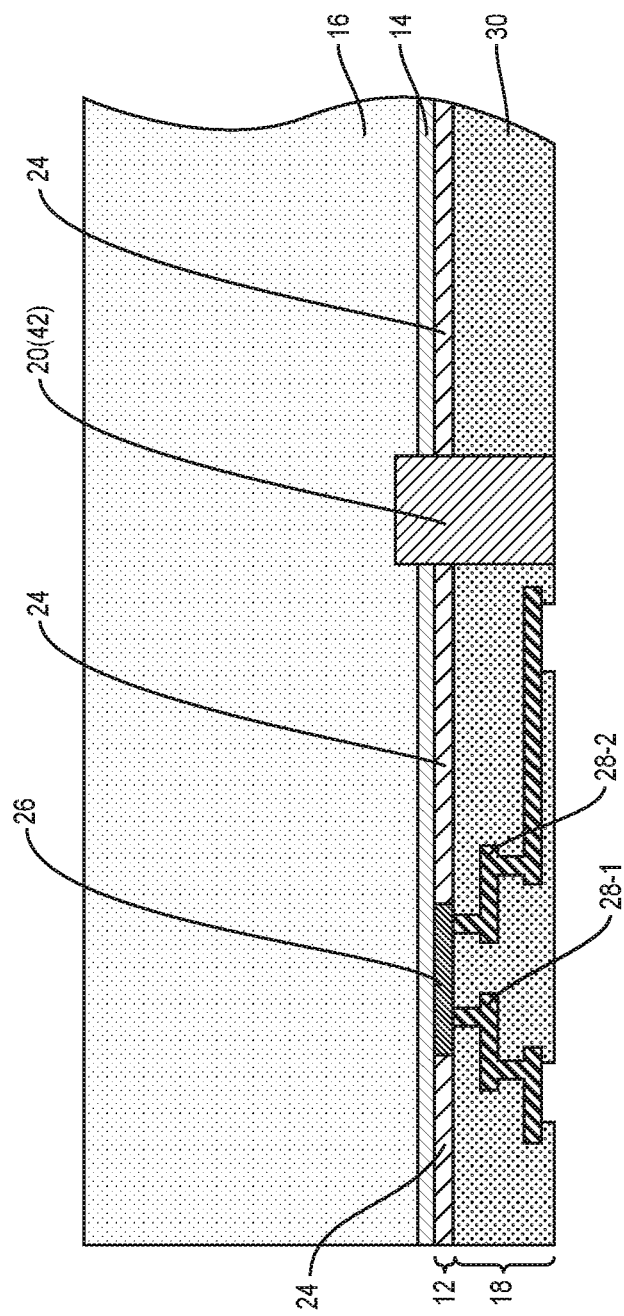

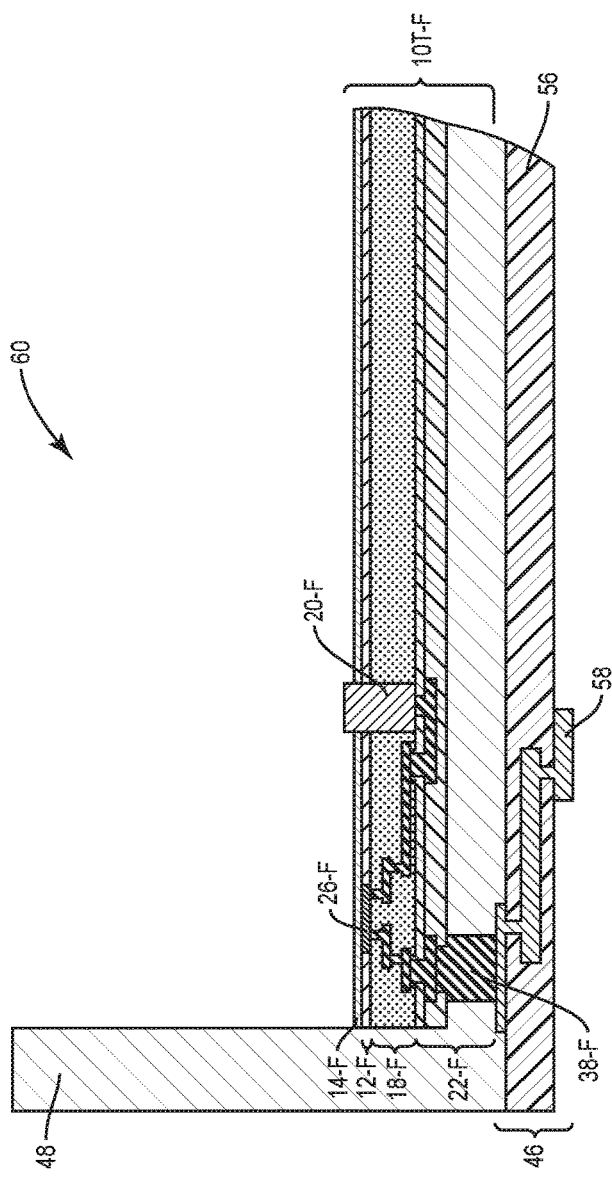

MICROELECTRONICS PACKAGE WITH VERTICALLY STACKED DIES

FIELD OF THE DISCLOSURE

The present disclosure relates to a microelectronics package and a process for making the same, and more particularly to a microelectronics package with vertically stacked flip-chip dies, and a packaging process to stack flip-chip dies vertically.

BACKGROUND

With the popularity of portable consumer electronic products, such as smart phones, tablet computers, and so forth, stacked-die assemblies become more and more attractive in microelectronics packages to achieve electronics densification in a small footprint. However, the thickness of each stacked semiconductor die may result in a large thickness of the microelectronics package, which may not meet low-profile requirements for modern portable products. Such low profile requirements limit significantly the number of the semiconductor dies that can be stacked.

In the microelectronics package, the stacked semiconductor dies may convey signals to each other by different coupling methods, such as magnetic coupling and capacitive coupling. The magnetic coupling may be used to transfer signals between non-electrical-connection stacked dies. However, the signal transfer function is critically dependent on the precise value of magnetic coupling coefficients, and such precision in the magnetic coupling coefficients imposes strict constraints on the alignment between stacked semiconductor dies. Accurate alignment techniques, such as optical alignment, are very expensive and not preferred for low cost products. Consequently, the capacitive coupling, which has well defined capacitive coupling coefficients and does not suffer significantly from shifts and misalignments in a stacked-die assembly process, is widely utilized to transfer signals between stacked dies. The key requirement for the capacitive coupling is to have electric connections between the stacked semiconductor dies.

Accordingly, there remains a need for improved microelectronics package designs, which accommodate the low-profile requirements for portable products and avoid superior alignment request in semiconductor die stacking assembly without expensive and complicated processes.

SUMMARY

The present disclosure relates to a microelectronics package with vertically stacked flip-chip dies, and a process for making the same. The disclosed microelectronics package includes a module board, a first thinned flip-chip die, a first mold compound, and a second flip-chip die. The first thinned flip-chip die includes a first device layer, a first through-die via, and a first package contact. Herein, a top portion of the first through-die via is exposed at the top of the first thinned flip-chip die. The first package contact is exposed at the bottom of the first thinned flip-chip die, and is coupled to the module board. The first device layer includes a first device component, which is electrically coupled to the first through-die via and the first package contact. The first mold compound resides over the module board, underfills the first thinned flip-chip die, encapsulates sides of the first thinned flip-chip die, and extends vertically beyond the first thinned flip-chip die 10T-B to define a first opening within the first mold compound and vertically above the first thinned flip chip die. The first mold compound does not reside over the first thinned flip chip die. In addition, the second flip-chip die, which has a smaller plane size than the first thinned flip-chip die, is stacked with the first thinned flip chip die, and resides within the first opening and over the first thinned flip chip die. The second flip-chip die includes a second device layer and a second package contact, which is exposed at the bottom of the second flip-chip die, and is coupled to the first through-die via. The second device layer includes a second device component, which is electrically coupled to the second package contact.

In one embodiment of the microelectronics package, the first thinned flip-chip die does not include a silicon handle layer and further includes a first stop layer, a first back-end-of-line (BEOL) BEOL layer, and a first redistribution structure with the first package contact. Herein, the first stop layer resides over the first device layer and is exposed at the top of the first thinned flip-chip die. The first BEOL layer resides underneath the first device layer. The first redistribution structure resides underneath the first BEOL layer and at the bottom of the first thinned flip-chip die. The first through-die via extends through the first BEOL layer, the first device layer, and the first stop layer, and the top portion of the first through-die via extends beyond the first stop layer.

In one embodiment of the microelectronics package, the exposed top portion of the first through-die via has a thickness between 0 and 100 μm.

In one embodiment of the microelectronics package, the first through-die via is formed of one of a group consisting of platinum, gold, silver, copper, aluminum, tungsten, titanium, and electrically conductive epoxy.

In one embodiment of the microelectronics package, the second flip-chip die further includes a second stop layer, a silicon handle layer, a second BEOL layer, and a second redistribution structure with the second package contact. Herein, the second stop layer resides over the second device layer. The silicon handle layer resides over the second stop layer and at the top of the second flip-chip die. The second BEOL layer resides underneath the second device layer. The second redistribution structure resides underneath the second BEOL layer and at the bottom of the second flip-chip die. In addition, the microelectronics package further includes a second mold compound filling the first opening. The second mold compound resides over the first thinned flip-chip die, such that the second mold compound encapsulates the second package contact and the exposed top portion of the first through-die via, and underfills the second flip-chip die between the second redistribution structure and the first thinned flip-chip die. The second mold compound is directly surrounded by the first mold compound. The second mold compound fully encapsulates the second flip-chip die.

In one embodiment of the microelectronics package, the first mold compound and the second mold compound are formed from a same material.

In one embodiment of the microelectronics package, the first mold compound and the second mold compound have a thermal conductivity greater than 1 W/m·K, and have an electrical resistivity greater than 1E6 Ohm-cm.

In one embodiment of the microelectronics package, the second flip-chip die is a thinned flip-chip die that does not include a silicon handle layer and further includes a second stop layer, a second BEOL layer, and a second redistribution structure with the second package contact. Herein, the second stop layer resides over the second device layer and is exposed at the top of the second flip-chip die. The second BEOL layer resides underneath the second device layer. The second redistribution structure resides underneath the second BEOL layer and at the bottom of the second flip-chip die. In addition, the microelectronics package further includes a second mold compound and a third mold compound. The second mold compound resides over the first thinned flip-chip die, such that the second mold compound encapsulates the second package contact and the exposed top portion of the first through-die via, and underfills the second flip-chip die between the second redistribution structure and the first thinned flip-chip die. The second mold compound encapsulates sides of the second flip-chip die, and extends vertically beyond the second flip-chip die to define a second opening within the second mold compound and vertically above the second flip chip die. The second mold compound does not reside over the second flip chip die. The third mold compound resides over the second flip-chip die and fills the second opening. The second mold compound is directly surrounded by the first mold compound and the third mold compound is directly surrounded by the second mold compound.

In one embodiment of the microelectronics package, the first mold compound, the second mold compound, and the third mold compound are formed from a same material.

In one embodiment of the microelectronics package, the second flip-chip die is a thinned flip-chip die that does not include a silicon handle layer and further includes a second stop layer, a second BEOL layer, a second through-die via, and a second redistribution structure with the second package contact. Herein, the second stop layer resides over the second device layer and is exposed at the top of the second flip-chip die. The second BEOL layer resides underneath the second device layer. The second through-die via extends through the second BEOL layer, the second device layer, and the second stop layer, and a top portion of the second through-die via extends beyond the second stop layer and is exposed at the top of the second flip-chip die. The second redistribution structure resides underneath the second BEOL layer and at the bottom of the second flip-chip die. In addition, the microelectronics package further includes a second mold compound and a third flip-chip die. The second mold compound resides over the first thinned flip-chip die, such that the second mold compound encapsulates the second package contact and the exposed top portion of the first through-die via, and underfills the second flip-chip die between the second redistribution structure and the first thinned flip-chip die. The second mold compound encapsulates sides of the second flip-chip die, and extends vertically beyond the second flip-chip die to define a second opening within the second mold compound and vertically above the second flip chip die. The second mold compound does not reside over the second flip chip die and is directly surrounded by the first mold compound. The third flip-chip die is stacked with the second flip chip die, and resides within the second opening and over the second flip chip die. Herein, the third flip-chip die has a smaller plane size than the second flip-chip die. The third flip-chip die includes a third device layer and a third package contact, which is exposed at the bottom of the third flip-chip die, and is coupled to the second through-die via. The third device layer includes a third device component, which is electrically coupled to the third package contact.

In one embodiment of the microelectronics package, the third flip-chip die further includes a third stop layer, a silicon handle layer, a third BEOL layer, and a third redistribution structure with the third package contact. Herein, the third stop layer resides over the third device layer. The silicon handle layer resides over the third stop layer and at the top of the third flip-chip die. The third BEOL layer resides underneath the third device layer. The third redistribution structure resides underneath the third BEOL layer and at the bottom of the third flip-chip die. In addition, the microelectronics package further includes a third mold compound filling the second opening. As such, the third mold compound resides over the second flip-chip die, encapsulates the third package contact and the exposed top portion of the second through-die via, and underfills the third flip-chip die between the third redistribution structure and the second flip-chip die. The third mold compound fully encapsulates the third flip-chip die and is directly surrounded by the second mold compound.

In one embodiment of the microelectronics package, the third flip-chip die is a thinned flip-chip die that does not include a silicon handle layer and further includes a third stop layer, a third BEOL layer, and a third redistribution structure with the third package contact. Herein, the third stop layer resides over the third device layer and is exposed at the top of the third flip-chip die. The third BEOL layer resides underneath the third device layer. The third redistribution structure resides underneath the third BEOL layer and at the bottom of the third flip-chip die. In addition, the microelectronics package further includes a third mold compound and a fourth mold compound. The third mold compound resides over the second flip-chip die, such that the third mold compound encapsulates the third package contact and the exposed top portion of the second through-die via, and underfills the third flip-chip die between the third redistribution structure and the second flip-chip die. The third mold compound encapsulates sides of the third flip-chip die, and extends vertically beyond the third flip-chip die to define a third opening within the third mold compound and vertically above the third flip chip die. The third mold compound does not reside over the third flip chip die. The fourth mold compound resides over the third flip-chip die and fills the third opening. The third mold compound is directly surrounded by the second mold compound, and the fourth mold compound is directly surrounded by the third mold compound.

In one embodiment of the microelectronics package, the first mold compound, the second mold compound, the third mold compound, and the fourth mold compound are formed from a same material.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates an exemplary flip-chip die with a through-die via according to one embodiment of the present disclosure.

FIGS. 2A-2G provide exemplary steps that illustrate a process to fabricate the exemplary flip-chip die with the through-die via illustrated in FIG. 1.

Figure 4:
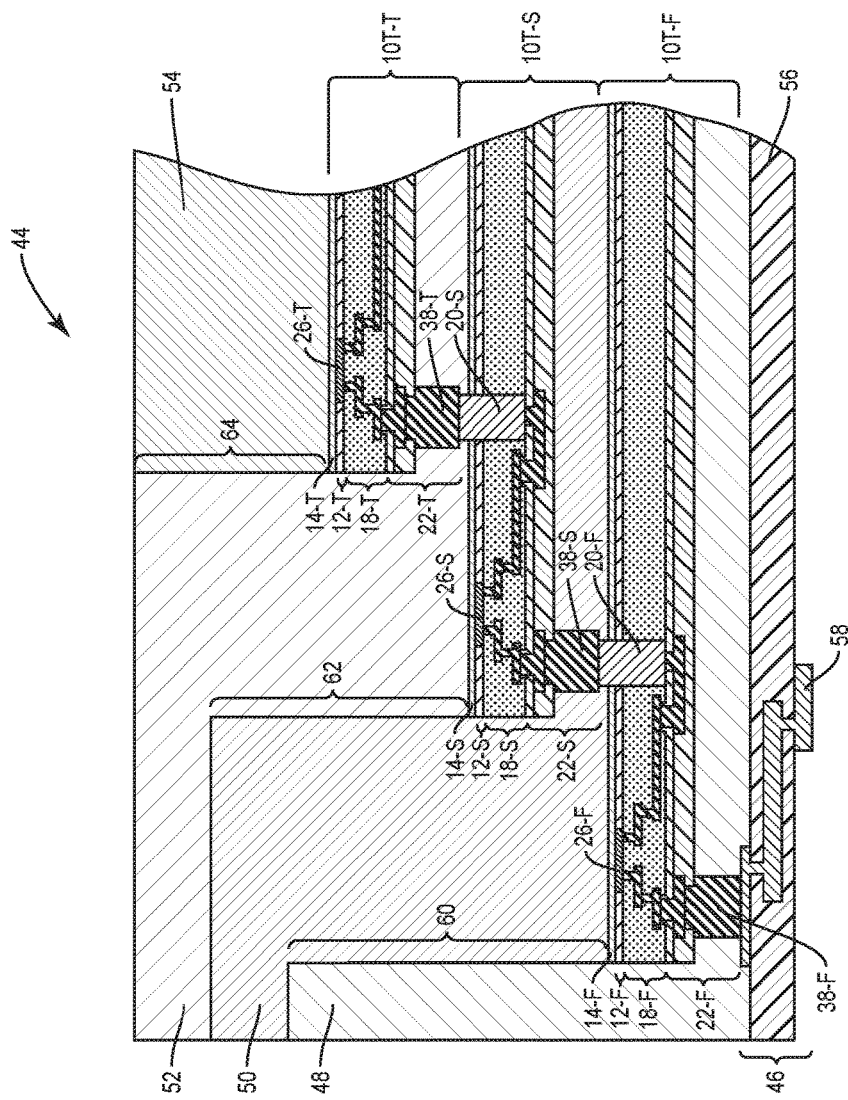
FIG. 4 illustrates an exemplary semiconductor package with stacked thinned flip-chip dies according to one embodiment of the present disclosure.

FIGS. 6A-6M provide exemplary steps that illustrate a process to fabricate the exemplary semiconductor package shown in FIG. 4.

It will be understood that for clear illustrations, FIGS. 1-6M may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
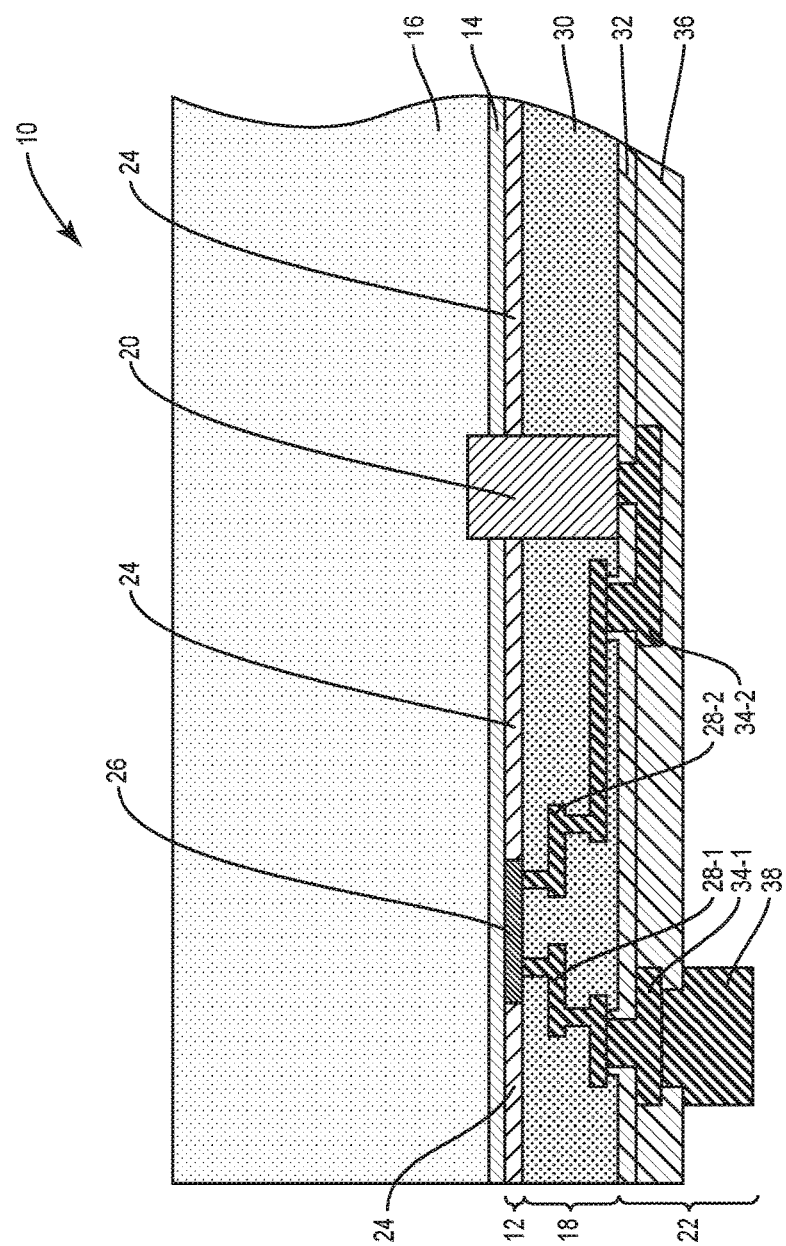

The present disclosure relates to a microelectronics package with vertically stacked flip-chip dies, and a process for making the same. FIG. 1 illustrates an edge portion of an exemplary flip-chip die 10, which may be stacked in a microelectronics package according to one embodiment of the present disclosure. Herein, the exemplary flip-chip die 10 includes a device layer 12, a stop layer 14, a silicon handle layer 16, a back-end-of-line (BEOL) layer 18, a through-die via 20, and a redistribution structure 22.

In detail, the device layer 12 with a thickness between 0.05 µm and 100 µm may be formed of silicon, silicon oxide, gallium arsenide, gallium nitride, silicon germanium, or the like. The device layer 12 includes an isolation region 24 and a device component 26 surrounded by the isolation region 24. The isolation region 24 may be formed by shallow trench isolation (STI). The device component 26 may be transistors, microelectromechanical systems (MEMS), metal-insulator-metal (MIM) capacitors, integrated passive devices (IPDs), filters (such as those built with surface acoustic wave and bulk acoustic wave technologies), inductors, transformers, transmission lines, and couplers. In different applications, there may be multiple device components embedded in the device layer 12, and surrounded by the isolation region 24 (not shown).

The stop layer 14 resides over the device layer 12 and may be configured to protect the device layer 12 against etching chemistries such as potassium hydroxide (KOH), sodium hydroxide (NaOH), and acetylcholine (ACH) in an etching process (more details in the following discussion). The stop layer 14 has a thickness between 10 nm and 10000 nm and may be formed of silicon oxide, silicon nitride, aluminum nitride, or other suitable materials against the etching chemistries. The silicon handle layer 16 resides over the stop layer 14, such that the stop layer 14 separates the device layer 12 from the silicon handle layer 16. Herein, the silicon handle layer 16 may have a thickness between 10 µm and 1000 µm, and a relatively low electrical resistivity less than 50 K Ohm-cm. In some applications, the silicon handle layer 16, the stop layer 14, and the device layer 12 may be formed from a silicon-on-insulator (SOI) structure, which refers to a structure including a silicon substrate, a silicon epitaxy layer, and a buried oxide (BOX) layer sandwiched between the silicon substrate and the silicon epitaxy layer. The silicon handle layer 16 is the silicon substrate of the SOI structure, the stop layer 14 is the BOX layer of the SOI structure, and the device layer 12 is formed from the silicon epitaxy layer of the SOI structure.

The BEOL layer 18 is underneath the device layer 12 and includes a number of inter-layer vias 28 and inter-layer dielectrics 30. Herein, the inter-layer vias 28 are electrically coupled to the device component 26, and partially encapsulated by the inter-layer dielectrics 30, such that a bottom surface portion of each inter-layer via 28 is exposed through the inter-layer dielectrics 30. The BEOL layer 18 may have a thickness between 0.5 µm and 20 µm. The inter-layer vias 28 may be formed of tungsten, copper, or other suitable conductive materials, and the inter-layer dielectrics 30 may be formed of silicon dioxide or other suitable dielectric films. The through-die via 20 extends through the BEOL layer 18, the device layer 12, and the stop layer 14, and into the silicon handle layer 16. The through-die via 20 may be formed of platinum, gold, silver, copper, aluminum, tungsten, titanium, electrically conductive epoxy, or other suitable materials. The through-die via 20 may have a shape of a cuboid, a cylinder, or a cone. In some applications, a top portion of the through-die via 20 may extend beyond the stop layer 14 and is encapsulated by the silicon handle layer 16. The top portion of the through-die via 20 into the silicon handle layer 16 may have a thickness between 0 and 100 µm. The top portion of the through-die via 20 may not extend beyond the silicon handle layer 16. In some applications, the top portion of the through-die via 20 may be coplanar with an upper surface of the stop layer 14 and may not extend beyond the stop layer 14. A bottom surface of the through-die via 20 is exposed through the BEOL layer 18, and the through-die via 20 does not extend into the redistribution structure 22. In different applications, there may be multiple through-die vias 20 included in the flip-chip die 10. Notice that, the through-die via 20 does not extend through portions where the inter-layer vias 28 and the device component 26 are located. As such the through-die via 20 extends through the inter-layer dielectrics 30 of the BEOL layer 18, but not the inter-layer via 28 of the BEOL layer 18, and extends through the isolation region 24 of the device layer 12, but not the device component 26.

For the purpose of this illustration, the redistribution structure 22 includes a first dielectric pattern 32 at the top, a number of redistribution interconnects 34, a second dielectric pattern 36, and a package contact 38. In practice, the redistribution structure 22 includes multiple package contacts 38 (not shown) for both electrical connection and mechanical support. The BEOL layer 18 resides directly over the redistribution structure 22, such that the BEOL layer 18 is in contact with the first dielectric pattern 32. Herein, the bottom surface portion of each inter-layer via 28 and the bottom surface portion of the through-die via 20 are exposed through the inter-layer dielectrics 30 and the first dielectric pattern 32. In one embodiment, a first redistribution interconnect 34-1 is electrically coupled to a first inter-layer via 28-1 and extends underneath the first dielectric pattern 32. A second redistribution interconnect 34-2 is electrically coupling a second inter-layer via 28-2 with the through-die via 20, and extends underneath the first dielectric pattern 32. The second dielectric pattern 36 is formed underneath the first dielectric pattern 32 to partially encapsulate the first redistribution interconnect 34-1 and to fully encapsulate the second redistribution interconnect 34-2. As such, a bottom surface portion of the first redistribution interconnect 34-1 is exposed through the second dielectric pattern 36, and no portion of the second redistribution interconnect 34-2 is exposed. The package contact 38 is electronically coupled to the first redistribution interconnect 34-1 through the second dielectric pattern 36. The package contact 38 is exposed at the bottom of the flip-chip die 10.

It is clear to those skilled in the art that a combination of the redistribution interconnects 34 and the inter-layer vias 28 may be configured to connect the device component 26 to the package contact 38, and/or connect the device component 26 to the through-die via 20. The first dielectric pattern 32 and the second dielectric pattern 36 may be formed from benzocyclobutene (BCB) or polyimide. The redistribution interconnects 34 may be formed of copper or other suitable metals. The package contact 38 may be copper pillar with solder alloys at the bottom for effective adhesion. In different applications, the BEOL layer 18 may include fewer or more inter-layer vias 28, and the redistribution structure 22 may include fewer or more redistribution interconnects 34. Further, the inter-layer vias 28 and the redistribution interconnects 34 may have different configurations, and provide different connections between the device component 26 and the through-die via 20, and/or between the device component 26 and the package contact 38.

FIGS. 2A-2G provide exemplary steps that illustrate a process to fabricate the exemplary flip-chip die 10 with the through-die via 20 illustrated in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2A-2G. The fabrication process to form the flip-chip die 10 with the through-die via 20 may be done at a wafer level.

Figure 2A:
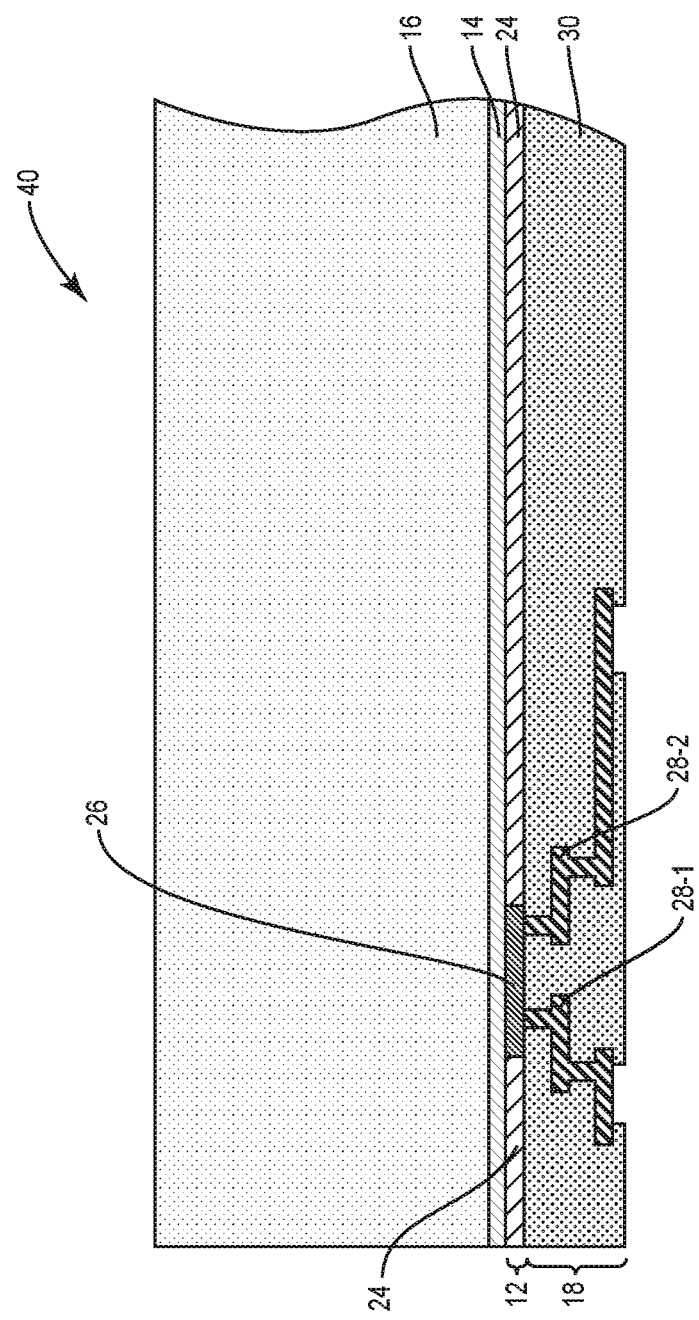

Initially, a precursor die 40, which may be built as a product by semiconductor foundries, is provided as depicted in FIG. 2A. For the purpose of this illustration, the precursor die 40 includes the device layer 12, the stop layer 14, the silicon handle layer 16, and the back-end-of-line (BEOL) layer 18. The device layer 12 includes the isolation region 24 and the device component 26 surrounded by the isolation region 24. The BEOL layer 18 includes the inter-layer vias 28 electrically coupled to the device component 26 and the inter-layer dielectrics 30 partially encapsulating the inter-layer vias 28, such that the bottom surface portion of each inter-layer via 28 is exposed through the inter-layer dielectrics 30. In different applications, the device layer 12 may include multiple device components 26 surrounded by the isolation region 24, and the BEOL layer 18 may include more inter-layer vias 28 corresponding to the multiple device components 26 (not shown).

Figure 2B:
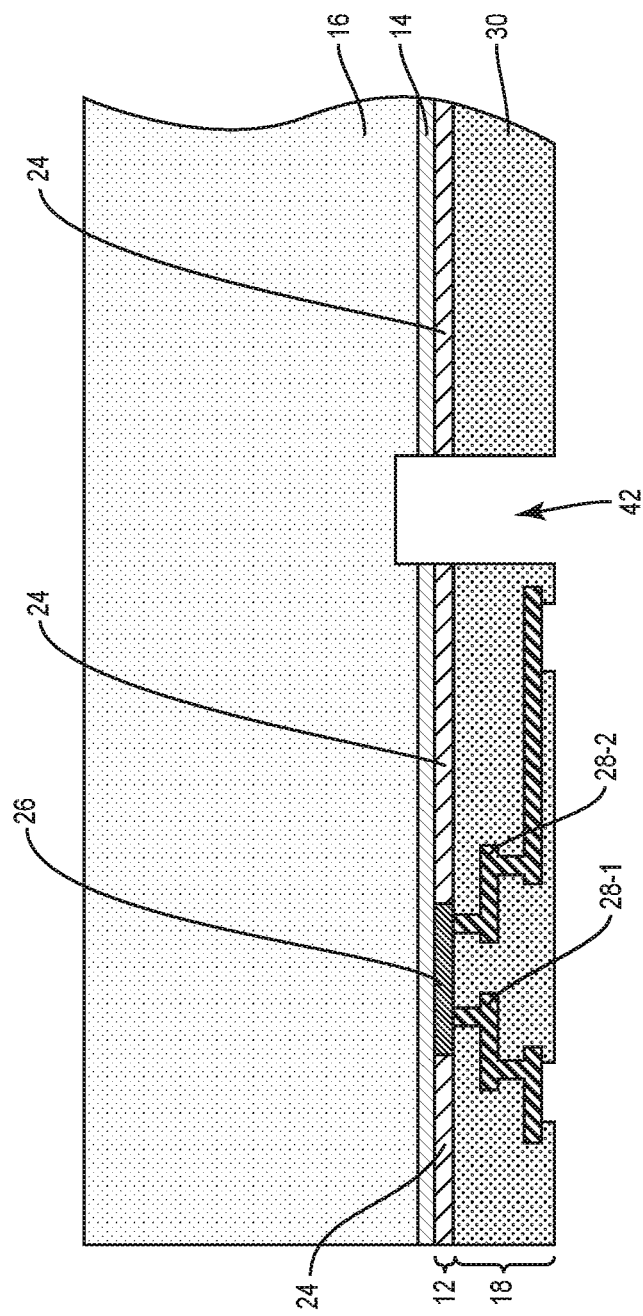

Next, a cavity 42 is formed through the BEOL layer 18, the device layer 12, and the stop layer 14, and into the silicon handle layer 16, as depicted in FIG. 2B. The cavity 42 does not extend through the portions where the inter-layer vias 28 and the device component 26 are located. As such the cavity 42 extends through the inter-layer dielectrics 30 of the BEOL layer 18, but not the inter-layer via 28 of the BEOL layer 18, and extends through the isolation region 24 of the device layer 12, but not the device component 26. The cavity 42 may have a shape of a cuboid, a cylinder, or a cone and has a depth greater than a thickness combination of the BEOL layer 18, the device layer 12, and the stop layer 14. A depth of a top portion of the cavity 42 extending into the silicon handle layer 16 may be between 0 and 100 µm. The cavity 42 may be formed by a selective etching process, such as lithography.

The through-die via 20 is then formed in the cavity 42 as depicted in FIG. 2C. The through-die via 20 may be formed by filling the cavity with one or more appropriate materials. The appropriate material is required to be electrically conductive, resistant to chemical etchants used in chemical removal of the silicon handle region 16 (more details in the following discussion), such as KOH, NaOH, and ACH, and suitable for solder adhesion of a die mounted above (more details in the following discussion). The appropriate material may be platinum, gold, silver, copper, aluminum, tungsten, titanium, electrically conductive epoxy, or other suitable materials.

Figure 2D:
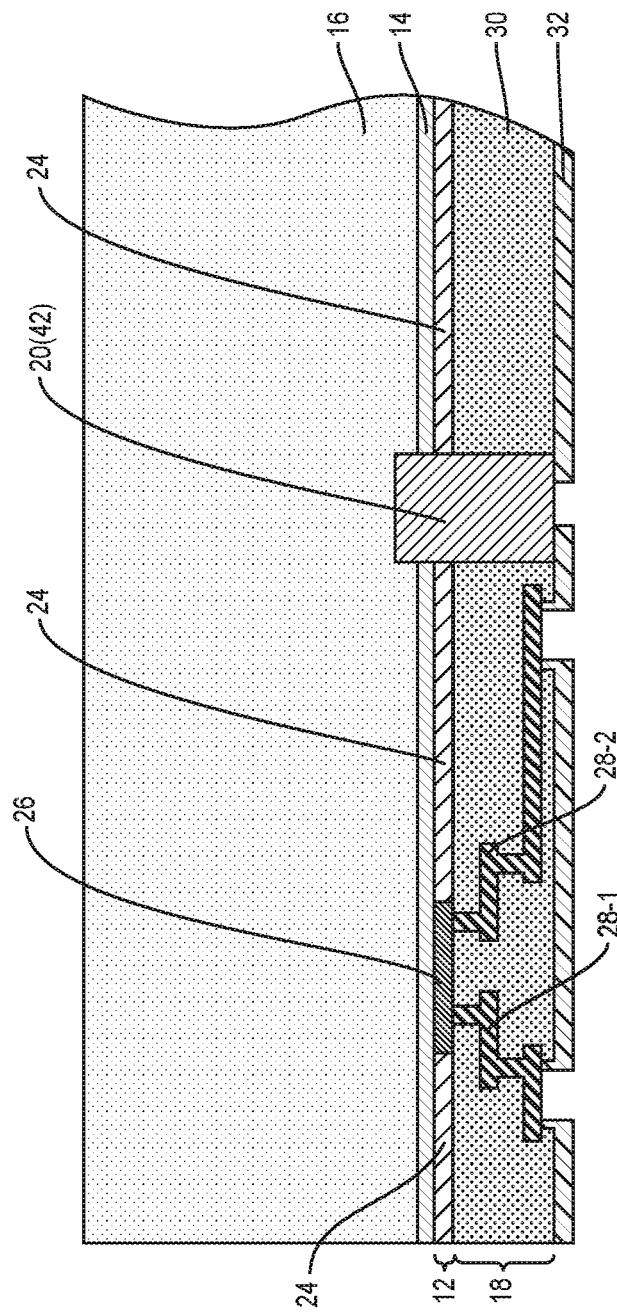
Figure 2E:
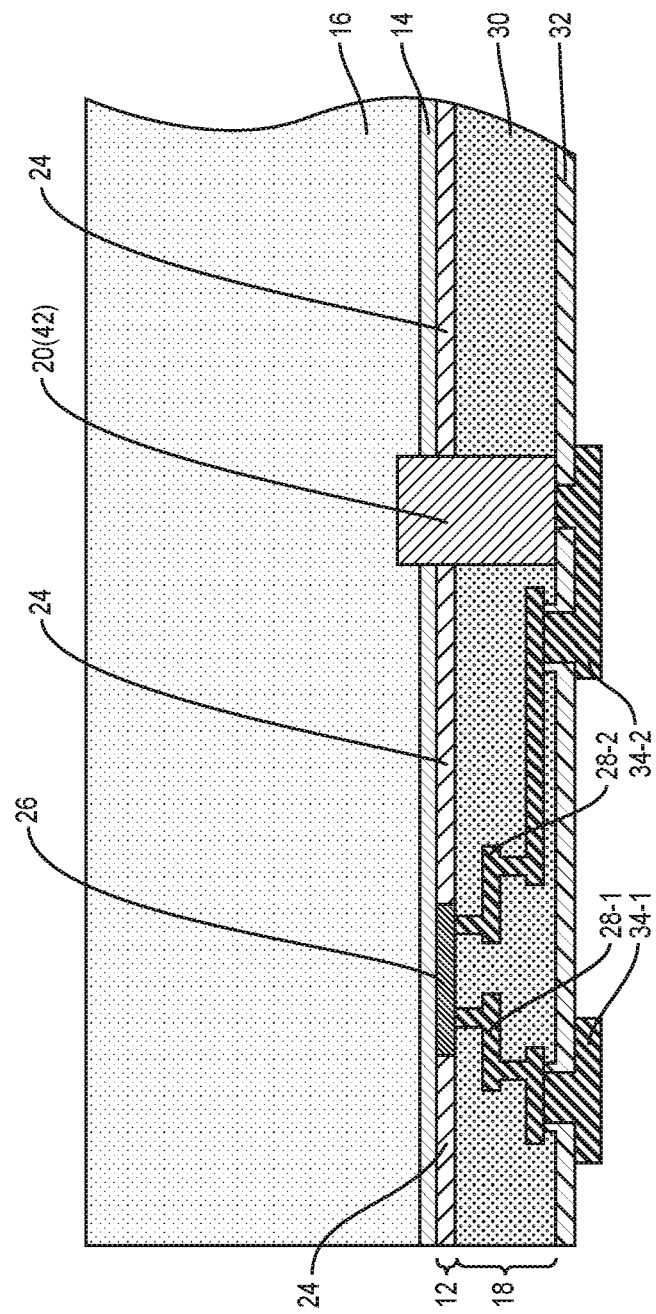
Figure 2F:
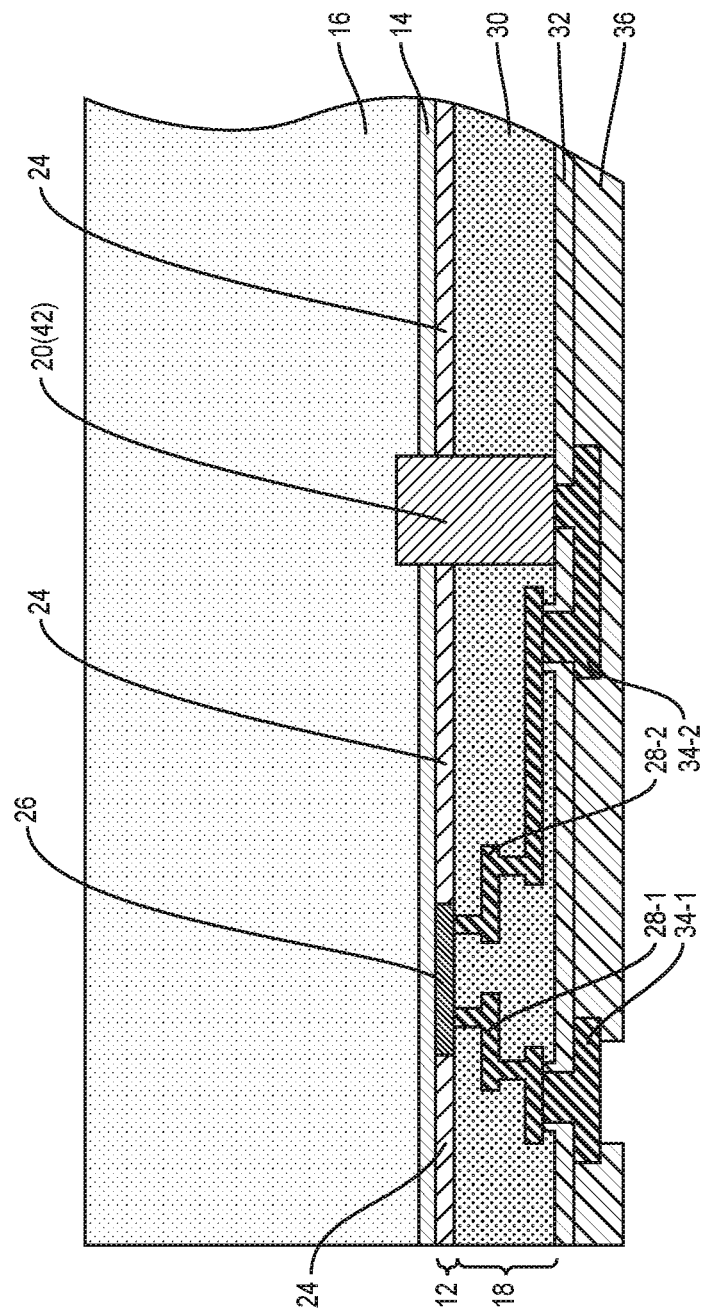
Figure 2G:
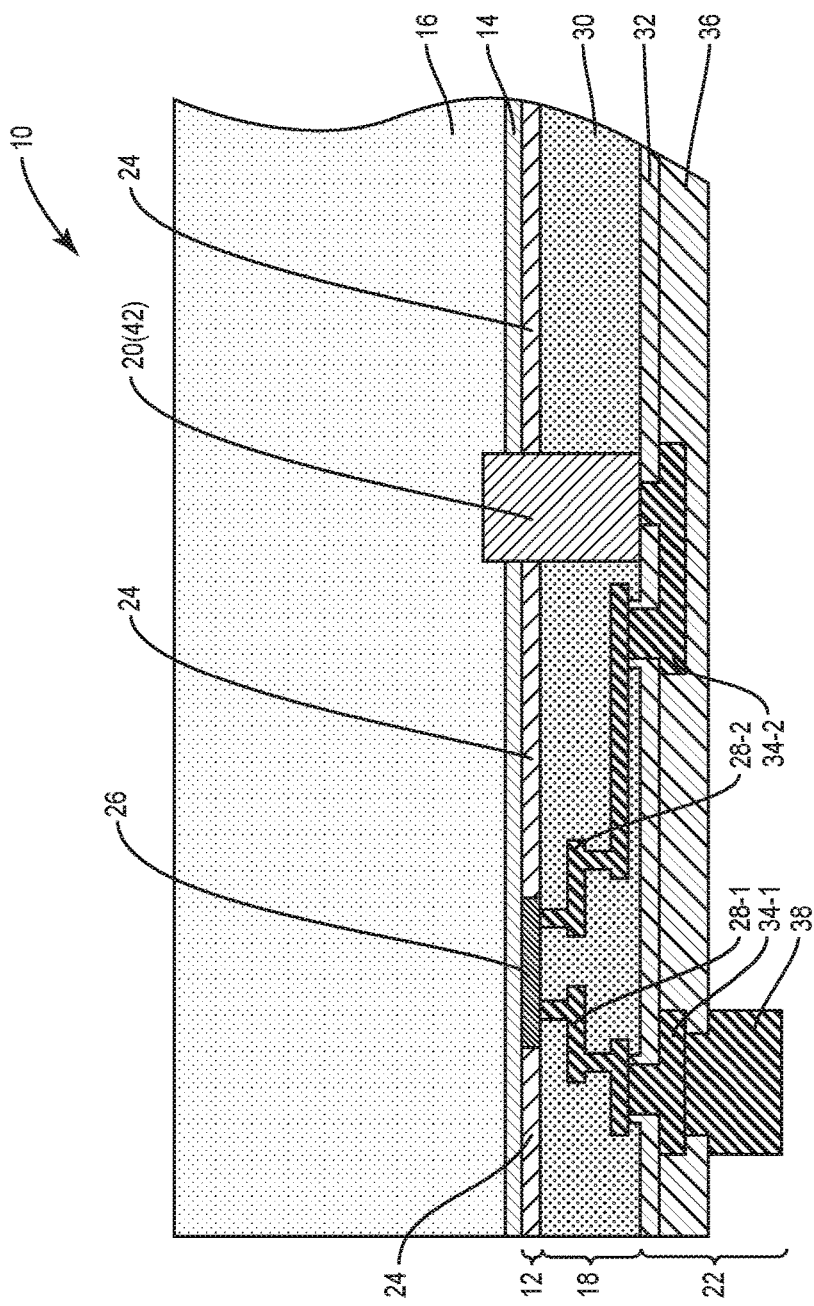

With reference to FIGS. 2D through 2G, the redistribution structure 22 is formed to complete the flip-chip die 10 according to one embodiment of the present disclosure. The first dielectric pattern 32 is firstly formed underneath the BEOL layer 18, as illustrated in FIG. 2D. The bottom surface portion of each inter-layer via 28 and the bottom surface portion of the through-die via 20 are exposed through the inter-layer dielectrics 30 and the first dielectric pattern 32. Next, the redistribution interconnects 34 are formed as illustrated in FIG. 2E. The first redistribution interconnect 34-1 is electrically coupled to the first inter-layer via 28-1 and extends underneath the first dielectric pattern 32. The second redistribution interconnect 34-2 is electrically coupling the second inter-layer via 28-2 with the through-die via 20, and extends underneath the first dielectric pattern 32. The second dielectric pattern 36 is then formed underneath the first dielectric pattern 32 to partially encapsulate the first redistribution interconnect 34-1 and to fully encapsulate the second redistribution interconnect 34-2, as illustrated in FIG. 2F. As such, the bottom surface portion of the first redistribution interconnect 34-1 is exposed through the second dielectric pattern 36, and no portion of the second redistribution interconnect 34-2 is exposed. Lastly, the package contact 38 is applied to the exposed portion of the first redistribution interconnect 34-1, as illustrated in FIG. 2G. Herein, the combination of the redistribution interconnects 34 and the inter-layer vias 28 may be configured to connect the device component 26 to the package contact 38, and/or connect the device component 26 to the through-die via 20.

Herein, the through-die via 20 is formed during a packaging portion of a bumping process. In some cases, the silicon foundries themselves may build the through-die via 20 within the precursor die 40 and make connections between the through-die via 20 and the BEOL layer 18. Consequently, during the following bumping process, there is no second redistribution interconnect 34-2 needed to couple the through-die via 20 to the BEOL layer 18 (not shown).

Figure 3:
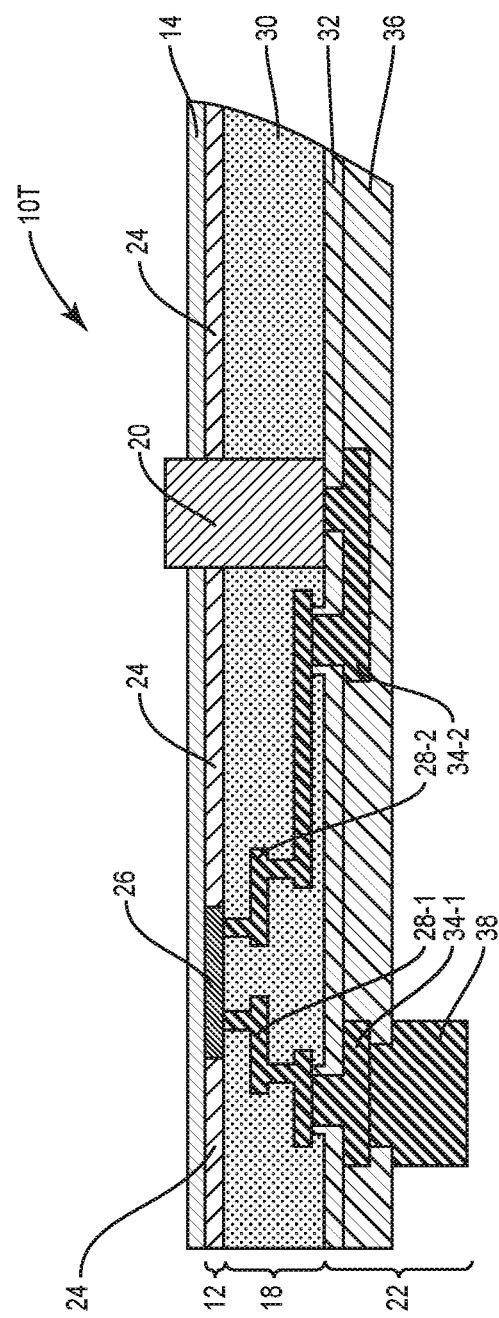
FIG. 3 illustrates a thinned flip-chip die formed from the exemplary flip-chip die illustrated in FIG. 1.

FIG. 3 illustrates an edge portion of a thinned flip-chip die 10T formed from the flip-chip die 10 illustrated in FIG. 1. Compared to the flip-chip die 10, the thinned flip-chip die 10T does not include the silicon handle layer 16, such that the stop layer 14 is exposed at the top of the thinned flip-chip die 10T. The top portion of the through-die via 20, which may extend beyond the stop layer 14 or may be coplanar with the upper surface of the stop layer 14, is also exposed at the top of the thinned flip-chip die 10T, and has a thickness between 0 and 100 μm. The package contact 38 is still exposed at the bottom of the thinned flip-chip die 10T.

FIG. 4 illustrates an edge portion of an exemplary semiconductor package 44 with stacked thinned flip-chip dies according to one embodiment of the present disclosure. For the purpose of this illustration, the semiconductor package 44 includes a first thinned flip-chip die 10T-F, a second thinned flip-chip die 10T-S, a third thinned flip-chip die 10T-T, a module board 46, a first mold compound 48, a second mold compound 50, a third mold compound 52, and a fourth mold compound 54. The first thinned flip-chip die 10T-F, the second thinned flip-chip die 10T-S, and the third thinned flip-chip die 10T-T are stacked vertically from bottom to top. In different applications, the semiconductor package 44 may include none or multiple second thinned flip-chip dies 10T-S stacked between the first thinned flip-chip die 10T-F and the third thinned flip-chip die 10T-T. The plane sizes of the stacked thinned flip-chip dies decrease from bottom to top. For instance, the first thinned flip-chip die 10T-F has a larger plane size than the second thinned flip-chip die 10T-S, and the second thinned flip-chip die 10T-S has a larger plane size than the third thinned flip-chip die 10T-T.

In detail, the module board 46 may be a multilayer laminate or ceramic substrate. The module board 46 includes a board body 56 and a board via structure 58 extending over, through and underneath the board body 56. The first thinned flip-chip die 10T-F, which has essentially the same configuration as the thinned flip-chip die 10T shown in FIG. 3, resides over the module board 46 (for simplification and clarity, only selective components of the first thinned flip-chip die 10T-F are labeled with reference numbers). Herein, the first thinned flip-chip die 10T-F has a same number and order of layers as the thinned flip-chip die 10T, and includes a first device layer 12-F with a first device component 26-F, a first stop layer 14-F, a first BEOL layer 18-F, a first through-die via 20-F, and a first redistribution structure 22-F with a first package contact 38-F. As such, the first stop layer 14-F and a top portion of the first through-die via 20-F are exposed at the top of the first thinned flip-chip die 10T-F. The exposed top portion of the first through-die via 20-F has a thickness between 0 and 100 μm. The first package contact 38-F is exposed at the bottom of the first thinned flip-chip die 10T-F, and is attached to the exposed portion of the board via structure 58 of the module board 46. Both the first through-die via 20-F and the first package contact 38-F are electrically coupled to the first device component 26-F within the first device layer 12-F. However, each layer of the first thinned flip-chip die 10T-F and the corresponding layer of the thinned flip-chip die 10T may have a same or different number of electronic components (such as device component, inter-layer vias, redistribution interconnects, and/or package contacts). Further, the first thinned flip-chip die 10T-F and the thinned flip-chip die 10T may have a same or different number of through-die vias.

The first mold compound 48 resides over the module board 46, such that the first mold compound 48 encapsulates the first package contact 38-F and the exposed portion of the board via structure 58 over the board body 56, and underfills the first thinned flip-chip die 10T-F between the first redistribution structure 22-F and the module board 46. In addition, the first mold compound 48 encapsulates the sides of the first thinned flip-chip die 10T-F (only one side of the first thinned flip-chip die 10T-F is shown) and extends vertically beyond the first thinned flip-chip die 10T-F to define a first opening 60 (only a portion of the first opening 60 is shown) within the first mold compound 48 and vertically above the first thinned flip-chip die 10T-F. The first mold compound 48 does not reside over the first thinned flip-chip die 10T-F.

The second thinned flip-chip die 10T-S, which has essentially the same configuration as the first thinned flip-chip die 10T-F, resides over the first thinned flip-chip die 10T-F and within the first opening 60 (for simplification and clarity, only selective components of the second thinned flip-chip die 10T-S are labeled with reference numbers). Herein, the second thinned flip-chip die 10T-S has a same number and order of layers as the first thinned flip-chip die 10T-F and includes a second device layer 12-S with a second device component 26-S, a second stop layer 14-S, a second BEOL layer 18-S, a second through-die via 20-S, and a second redistribution structure 22-S with a second package contact 38-S. As such, the second stop layer 14-S and a top portion of the second through-die via 20-S are exposed at the top of the second thinned flip-chip die 10T-S. The second package contact 38-S is exposed at the bottom of the second thinned flip-chip die 10T-S, and is attached to the first through-die via 20-F. Both the second through-die via 20-S and the second package contact 38-S are electrically coupled to the second device component 26-S within the second device layer 12-S. However, the second thinned flip-chip die 10T-S has a smaller plane size than the first thinned flip-chip die 10T-F. Each layer of the second thinned flip-chip die 10T-S and the corresponding layer of the first thinned flip-chip die 10T-F may have a same or different number of electronic components (such as device component, inter-layer vias, redistribution interconnects, and/or package contacts). Further, the second thinned flip-chip die 10T-S and the first thinned flip-chip die 10T-F may have a same or different number of through-die vias 20.

The second mold compound 50 resides over the first thinned flip-chip die 10T-F, such that the second mold compound 50 encapsulates the second package contact 38-S and the exposed top portion of the first through-die via 20-F, and underfills the second thinned flip-chip die 10T-S between the second redistribution structure 22-S and the first thinned flip-chip die 10T-F. In addition, the second mold compound 50 encapsulates the sides of the second thinned flip-chip die 10T-S (only one side of the second thinned flip-chip die 10T-S is shown) and extends vertically beyond the second thinned flip-chip die 10T-S to define a second opening 62 (only a portion of the second opening 62 is shown) within the second mold compound 50 and vertically above the second thinned flip-chip die 10T-S. Herein, the second opening 62 is confined within the first opening 60. The second mold compound 50 does not reside over the second thinned flip-chip die 10T-S, and is directly surrounded by the first mold compound 48. In some applications, a portion of the second mold compound 50 may reside over an upper surface of the first mold compound 48.

The third thinned flip-chip die 10T-T, which has essentially the same configuration as the second thinned flip-chip die 10T-S, resides over the second thinned flip-chip die 10T-S and within the second opening 62 (for simplification and clarity, only selective components of the third thinned flip-chip die 10T-T are labeled with reference numbers). Since the second opening 62 is confined within the first opening 60, the third thinned flip-chip die 10T-T also resides within the first opening 60. Herein, the third thinned flip-chip die 10T-T has a same number and order of layers as the second thinned flip-chip die 10T-S, and includes a third device layer 12-T with a third device component 26-T, a third stop layer 14-T, a third BEOL layer 18-T, and a third redistribution structure 22-T with a third package contact 38-T. As such, the third stop layer 14-T is exposed at the top of the third thinned flip-chip die 10T-T. The third package contact 38-T is exposed at the bottom of the third thinned flip-chip die 10T-T, attached to the second through-die via 20-S, and electrically coupled to the third device component 26-T within the third device layer 12-T. However, the third thinned flip-chip die 10T-T has a smaller plane size than the second thinned flip-chip die 10T-S. Each layer of the third thinned flip-chip die 10T-T and the corresponding layer of the second thinned flip-chip die 10T-S may have a same or different number of electronic components (such as device component, inter-layer vias, redistribution interconnects, and/or package contacts). Further, the third thinned flip-chip die 10T-T is desired to have no through-die via and corresponding redistribution interconnect(s). In one embodiment, if there is no second thinned flip-chip die 10T-S, the third thinned flip-chip die 10T-T is directly stacked to the first thinned flip-chip die 10T-F, where the third package contact 38-T is attached to the first through-die via 20-F (not shown).

The third mold compound 52 resides over the second thinned flip-chip die 10T-S, such that the third mold compound 52 encapsulates the third package contact 38-T and the exposed top portion of the second through-die via 20-S, and underfills the third thinned flip-chip die 10T-T between the third redistribution structure 22-T and the second thinned flip-chip die 10T-S. In addition, the third mold compound 52 encapsulates the sides of the third thinned flip-chip die 10T-T (only one side of the third thinned flip-chip die 10T-T is shown) and extends vertically beyond the third thinned flip-chip die 10T-T to define a third opening 64 (only a portion of the third opening 64 is shown) within the third mold compound 52 and vertically above the third thinned flip-chip die 10T-T. Herein, the third opening 64 is confined within the middle opening 62. The third mold compound 52 does not reside over the third thinned flip-chip die 10T-T, and is directly surrounded by the second mold compound 50. In some applications, a portion of the third mold compound 52 may reside over an upper surface of the second mold compound 50.

The fourth mold compound 54 resides over the third thinned flip-chip die 10T-T and fills the third opening 64. In some applications, an upper surface of the fourth mold compound 54 is coplanar with an upper surface of the third mold compound 52. In some applications, a portion of the fourth mold compound 54 may reside over the upper surface of the third mold compound 52 (not shown).

Herein, the first, second, third and fourth mold compounds 48, 50, 52, and 54 may be formed of a same or different material. The second, third and fourth mold compounds 50, 52, and 54 may have a thermal conductivity greater than 1 W/m·K, or greater than 10 W/m·K. In addition, the second, third and fourth mold compounds 50, 52, and 54 may have an electrical resistivity greater than 1E6 Ohm-cm. Unlike the second, third and fourth mold compounds 50, 52, and 54, the first mold compound 48 does not have thermal conductivity or electrical resistivity requirements. However, from mechanical aspects, the first, second, third and fourth mold compounds 48, 50, 52, and 54 are desired to be formed of the same material to minimize mechanical stresses between the stacked thinned flip-chip dies. The first, second, third, and fourth mold compounds 48, 50, 52, and 54 may be formed of polymer, such as thermoset molding compounds.

Figure 5:
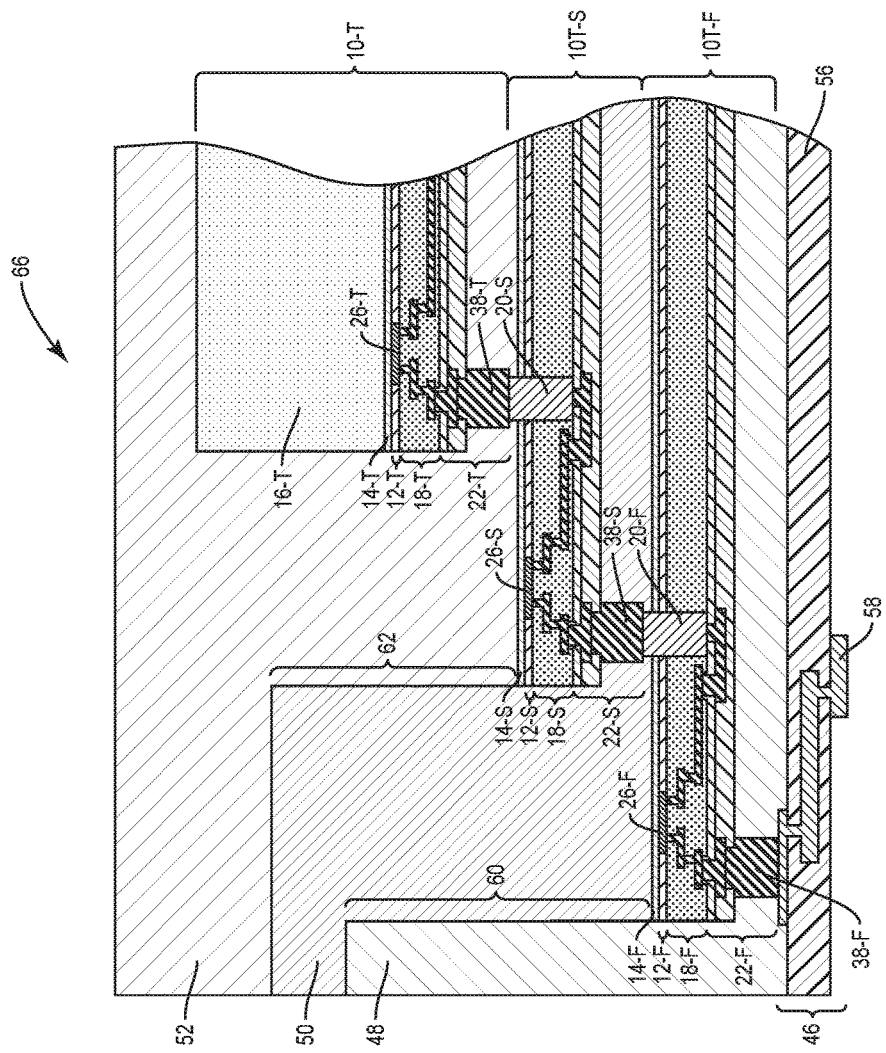
FIG. 5 illustrates an alternative semiconductor package according to one embodiment of the present disclosure.

FIG. 5 illustrates an edge portion of an alternative semiconductor package 66 with stacked flip-chip dies according to one embodiment of the present disclosure. In contrast to the semiconductor package 44 shown in FIG. 4, the alternative semiconductor package 66 includes a third flip-chip die 10-T instead of the third thinned flip-chip die 10T-T residing within the second opening 62 (within the first opening 60 as well) and attached to the second thinned flip-chip die 10T-S. In addition, the alternative semiconductor package 66 does not include the fourth mold compound 54.

The third flip-chip die 10-T, which has essentially the same configuration as the flip-chip die 10 shown in FIG. 1, resides over the second thinned flip-chip die 10T-S (for simplification and clarity, only selective components of the third flip-chip die 10-T are labeled with reference numbers). Herein, the third flip-chip die 10-T has a same number and order of layers as the flip-chip die 10, and includes the third device layer 12-T with the third device component 26-T, the third stop layer 14-T, a third silicon handle layer 16-T, the third BEOL layer 18-T, and the third redistribution structure 22-T with the third package contact 38-T. As such, the third silicon handle layer 16-T is at the top of the third flip-chip die 10-T. The third package contact 38-T is exposed at the bottom of the third flip-chip die 10-T, attached to the second through-die via 20-S, and electrically coupled to the third device component 26-T within the third device layer 12-T. However, each layer of the third flip-chip die 10-T and the corresponding layer of the flip-chip die 10 may have a same or different number of electronic components (such as device component, inter-layer vias, redistribution interconnects, and/or package contacts). In one embodiment, the third flip-chip die 10-T is desired to include no through-die via and corresponding redistribution interconnect(s).

Further, in the alternative semiconductor package 66, the third mold compound 52 fills the second opening 62, such that the third mold compound 52 resides over the second thinned flip-chip die 10T-S, encapsulates the third package contact 38-T and the exposed top portion of the second through-die via 20-S, underfills the third thinned flip-chip die 10T-T between the third redistribution structure 22-T and the second thinned flip-chip die 10T-S, and is directly surrounded by the second mold compound 50. In addition, the third mold compound 52 also fully encapsulates the third flip-chip die 10-T (only an edge portion of the third flip-chip die 10-T is shown). In some applications, a portion of the third mold compound 52 may reside over the upper surface of the second mold compound 50. In one embodiment, if there is no second thinned flip-chip die 10T-S, the third flip-chip die 10-T is directly stacked to the first thinned flip-chip die 10T-F, where the third package contact 38-T of the third flip-chip die 10-T is attached to the first through-die via 20-F of the first thinned flip-chip die 10T-F (not shown).

FIGS. 6A-6M provide exemplary steps that illustrate a process to fabricate the exemplary semiconductor package 44 shown in FIG. 4. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 6A-6M. The fabrication process to form the semiconductor package 44 may be done at a die level.

Figure 6A:
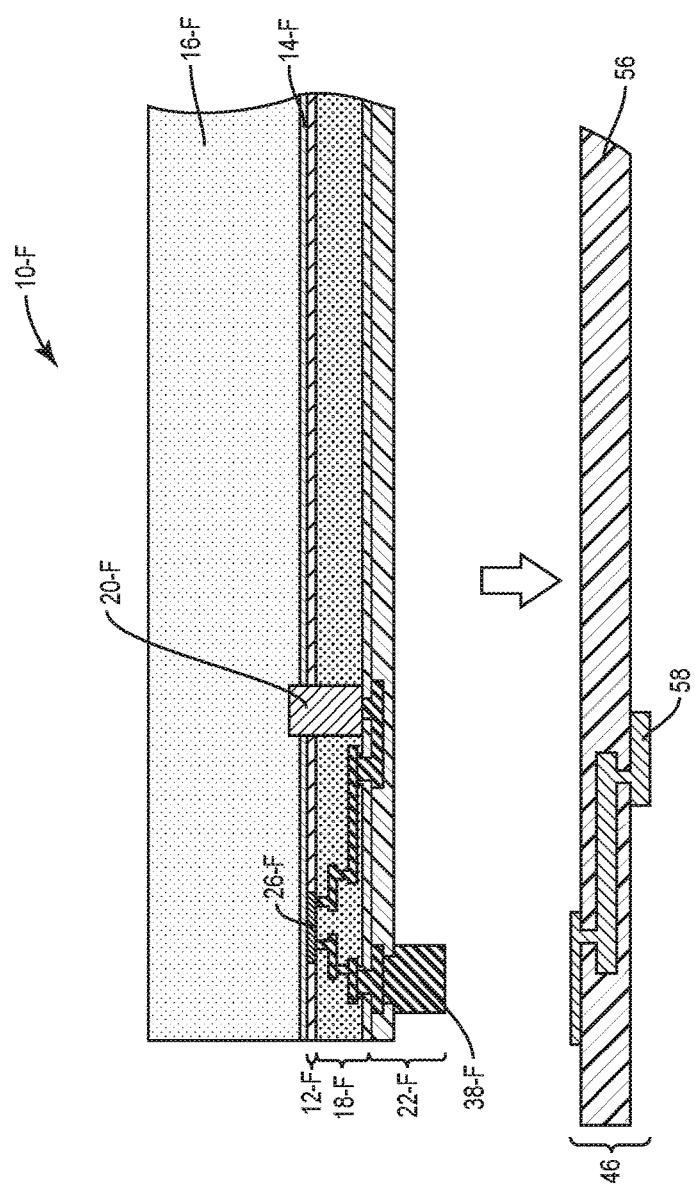

Initially, a first flip-chip die 10-F (only an edge portion of the first flip-chip die 10-F is shown) is attached to the module board 46 as depicted in FIG. 6A. In different applications, there might be multiple first flip-chip dies attached to the module board 46. Herein, the first flip-chip die 10-F has essentially the same configuration as the flip-chip die 10 shown in FIG. 1 (for simplification and clarity, only selective components of the first flip-chip die 10-F are labeled with reference numbers). The first flip-chip die 10-F has a same number and order of layers as the flip-chip die 10, and includes the first device layer 12-F with the first device component 26-F, the first stop layer 14-F, a first silicon handle layer 16-F, the first BEOL layer 18-F, the first through-die via 20-F, and the first redistribution structure 22-F with the first package contact 38-F. As such, the first silicon handle layer 16-F is at the top of the first flip-chip die 10-F. The first package contact 38-F is at the bottom of the first flip-chip die 10-F, and is configured to attach to the exposed portion of the board via structure 58 of the module board 46. Both the first through-die via 20-F and the first package contact 38-F are electrically coupled to the first device component 26-F within the first device layer 12-F. However, each layer of the first flip-chip die 10-F and the corresponding layer of the flip-chip die 10 may have a same or different number of electronic components (such as device component, inter-layer vias, redistribution interconnects, and/or package contacts). Further, the first flip-chip die 10-F and the flip-chip die 10 may have a same or different number of through-die vias 20.

Figure 6B:
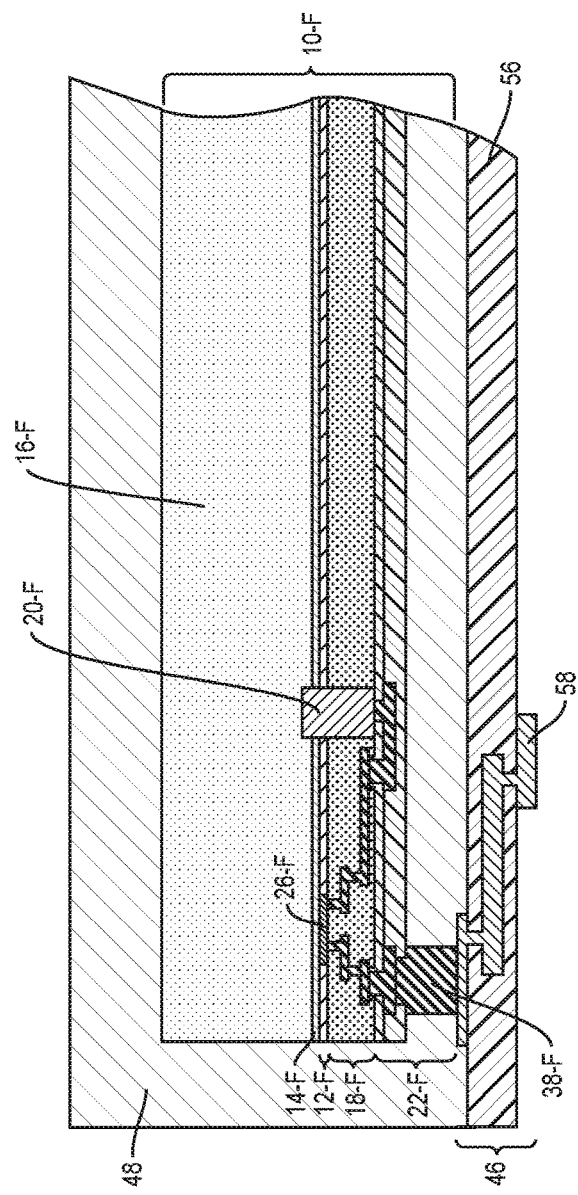

Next, the first mold compound 48 (only a portion of the first mold compound 48 is shown) is applied over the module board 46 as illustrated in FIG. 6B. Herein, the first mold compound 48 fully encapsulates the first flip-chip die 10-F and underfills the first flip-chip die 10-F between the first redistribution structure 22-F and the module board 46. The first mold compound 48 may be applied by various procedures, such as sheet molding, overmolding, compression molding, transfer molding, dam fill encapsulation, or screen print encapsulation. The first mold compound 48 may be formed of polymer materials, such as thermoset molding compounds or thermoset materials built with enhanced thermal additives. The first mold compound 48 may be used as an etchant barrier to protect the first flip-chip die 10-F against etching chemistries such as KOH, NaOH, and ACH. A curing process (not shown) is followed to harden the first mold compound 48. The curing temperature is between 100° C. and 320° C. depending on which material is used as the first mold compound 48.

Figure 6C:
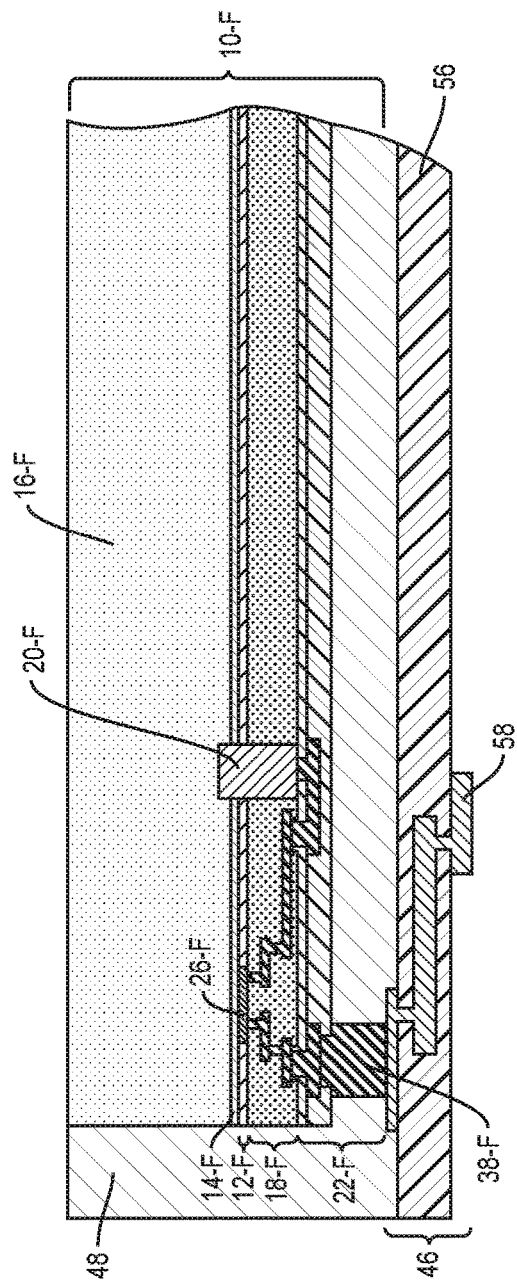

The first mold compound 48 is thinned down to expose a backside of the first silicon handle layer 16-F, as shown in FIG. 6C. The thinning procedure may be done with a mechanical grinding process. The following step is to remove the first silicon handle layer 16-F to create the first opening 60 (only a portion of the first opening 60 is shown) and provide the first thinned flip chip die 10T-F (only an edge portion of the first thinned flip-chip die 10T-F is shown), as shown in FIG. 6D. Herein, the first stop layer 14-F and the top portion of the first through-die via 20-F extending beyond the first stop layer 14-F are exposed at the bottom of the first opening 60. Removing the first silicon handle layer 16-F may be provided by an etching process with a wet/dry etchant chemistry, which may be TMAH, KOH, ACH, NaOH, or the like.

Figure 6E:
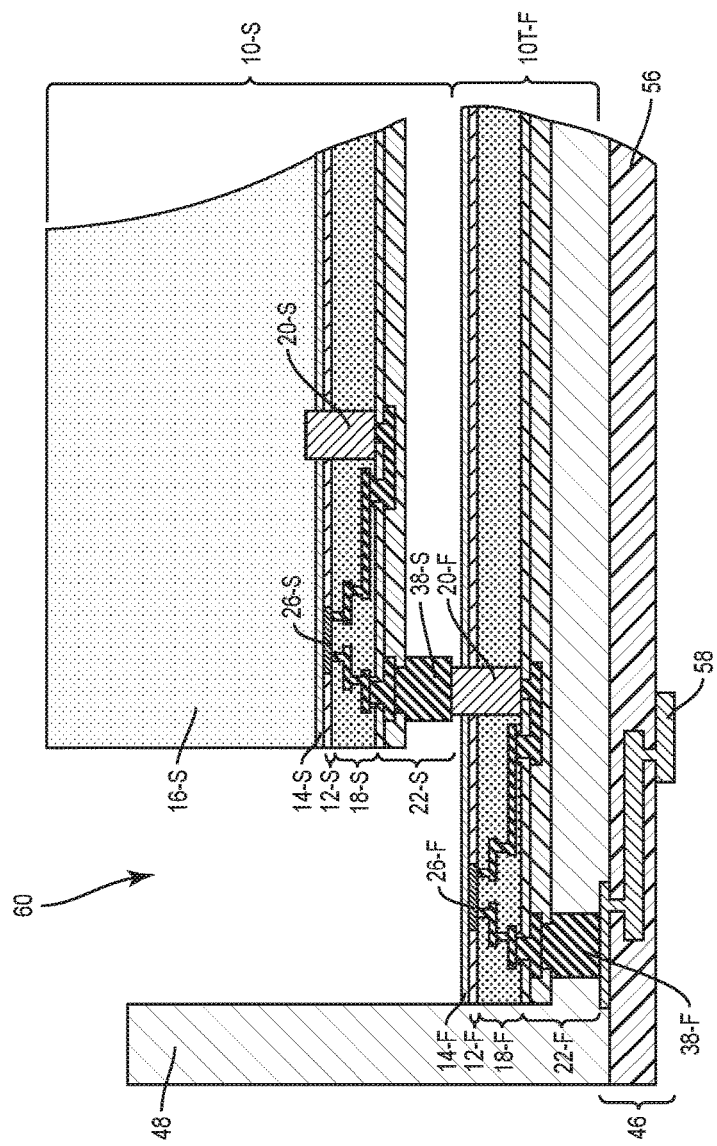

A second flip-chip die 10-S (only an edge portion of the second flip-chip die 10-S is shown) is then placed within the first opening 60 and stacked on the first thinned flip chip die 10T-F, as shown in FIG. 6E. The second flip-chip die 10-S is required to have a smaller plane size than the first thinned flip chip die 10T-F. Herein, the second flip-chip die 10-S has essentially the same configuration as the flip-chip die 10 shown in FIG. 1 (for simplification and clarity, only selective components of the second flip-chip die 10-S are labeled with reference numbers). The second flip-chip die 10-S has a same number and order of layers as the flip-chip die 10, and includes the second device layer 12-S with the second device component 26-S, the second stop layer 14-S, a second silicon handle layer 16-S, the second BEOL layer 18-S, the second through-die via 20-S, and the second redistribution structure 22-S with the second package contact 38-S. As such, the second silicon handle layer 16-S is at the top of the second flip-chip die 10-S. The second package contact 38-S is at the bottom of the second flip-chip die 10-S, and is attached to the exposed top portion of the first through-die via 20-F. Both the second through-die via 20-S and the second package contact 38-S are electrically coupled to the second device component 26-S within the second device layer 12-S. However, each layer of the second flip-chip die 10-S and the corresponding layer of the flip-chip die 10 may have a same or different number of electronic components (such as device component, inter-layer vias, redistribution interconnects, and/or package contacts). Further, the second flip-chip die 10-S and the flip-chip die 10 may have a same or different number of through-die vias.

Figure 6F:
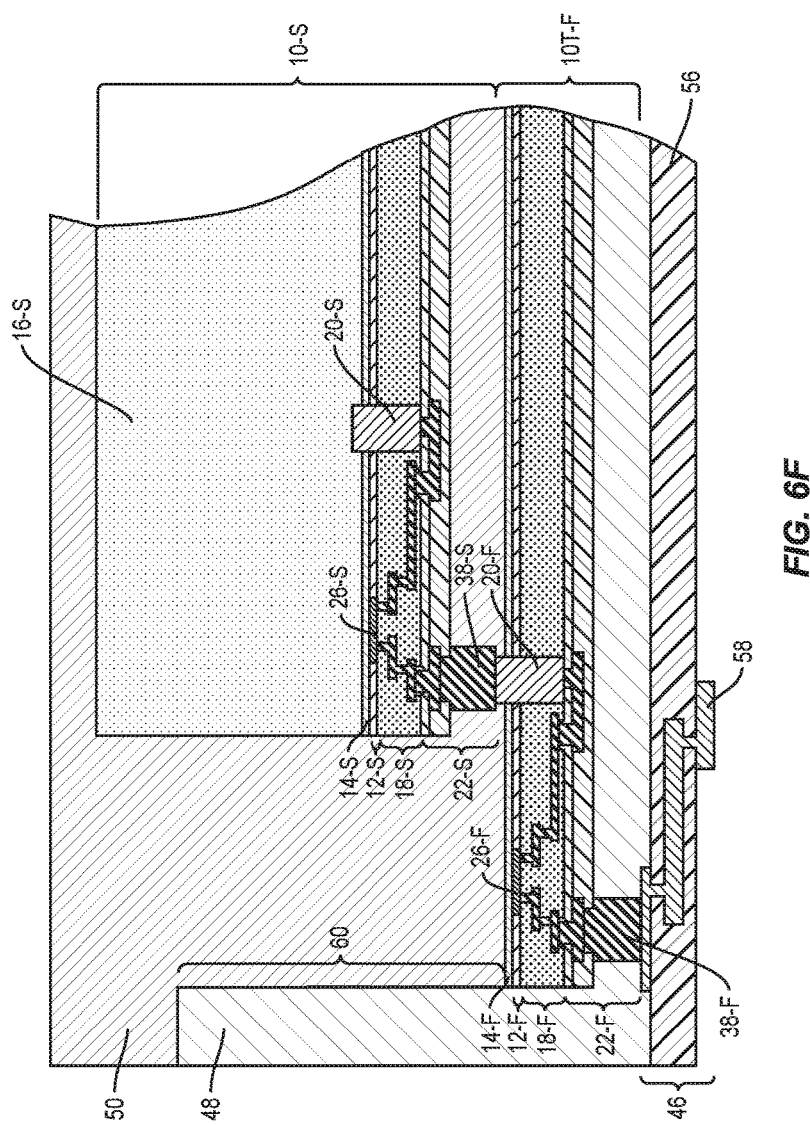

Next, the second mold compound 50 (only a portion of the second mold compound 50 is shown) is applied over the first thinned flip-chip die 10T-F as illustrated in FIG. 6F. Since the second flip-chip die 10-S has a smaller plane size than the first thinned flip chip die 10T-F, the second mold compound 50 is able to underfill the second flip-chip die 10-S between the second redistribution structure 22-S and the first thinned flip chip die 10T-F. In addition, the second mold compound 50 fully encapsulates the second flip-chip die 10-S and is directly surrounded by the first mold compound 48. The second mold compound 50 may be applied by various procedures, such as sheet molding, overmolding, compression molding, transfer molding, dam fill encapsulation, or screen print encapsulation. The second mold compound 50 may be formed of polymer materials, such as thermoset molding compounds or thermoset materials built with enhanced thermal additives. The second mold compound 50 may be used as an etchant barrier to protect the second flip-chip die 10-S against etching chemistries such as KOH, NaOH, and ACH. In one embodiment, a portion of the second mold compound 50 may reside over the upper surface of the first mold compound 48. A curing process (not shown) is followed to harden the second mold compound 50. The curing temperature is between 100° C. and 320° C. depending on which material is used as the second mold compound 50.

Figure 6G:
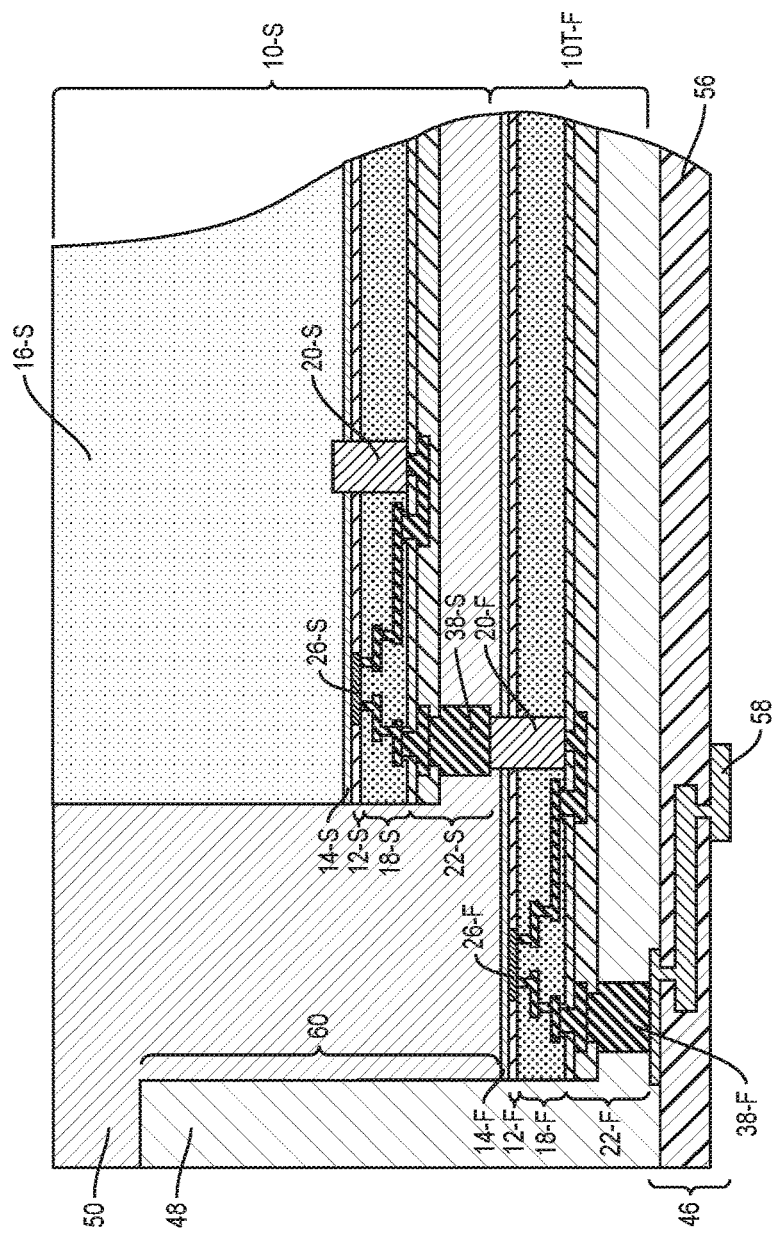
Figure 6H:
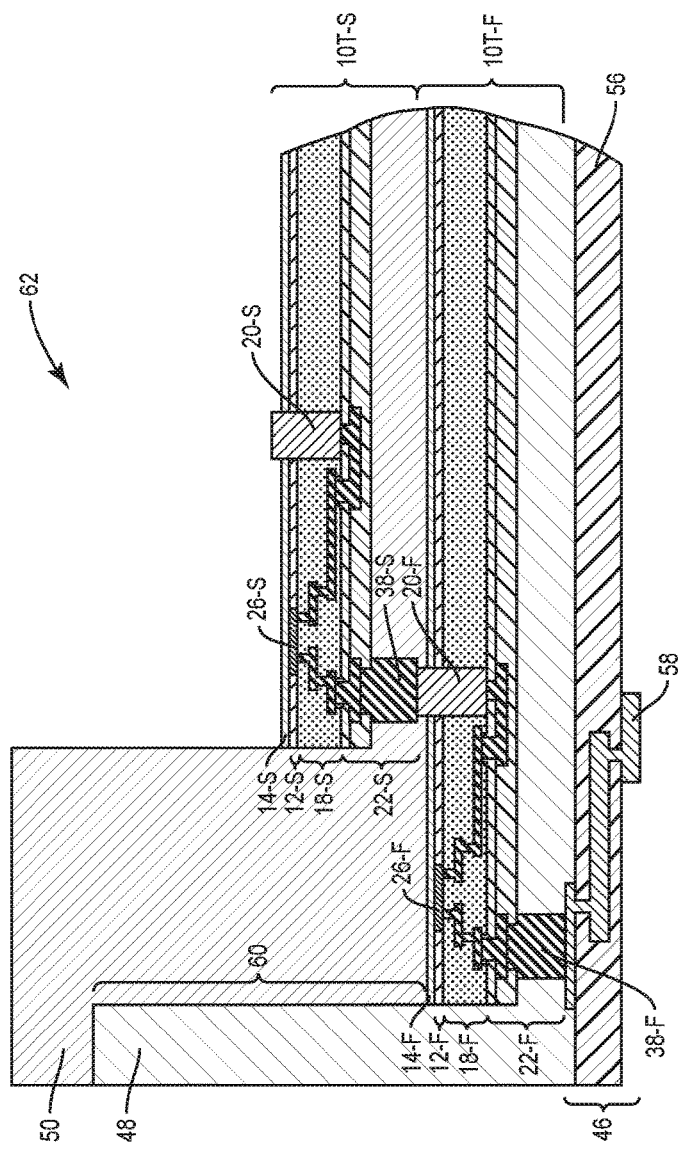

The second mold compound 50 is thinned down to expose a backside of the second silicon handle layer 16-S, as shown in FIG. 6G. The thinning procedure may be done with a mechanical grinding process. The following step is to remove the second silicon handle layer 16-S to create the second opening 62 (only a portion of the second opening 62 is shown) and provide the second thinned flip chip die 10T-S (only an edge portion of the second thinned flip-chip die 10T-S is shown), as shown in FIG. 6H. Herein, the second stop layer 14-S and the top portion of the second through-die via 20-S extending beyond the second stop layer 14-S are exposed at the bottom of the second opening 62. Removing the second silicon handle layer 16-S may be provided by an etching process with a wet/dry etchant chemistry, which may be TMAH, KOH, ACH, NaOH, or the like.

Figure 6I:
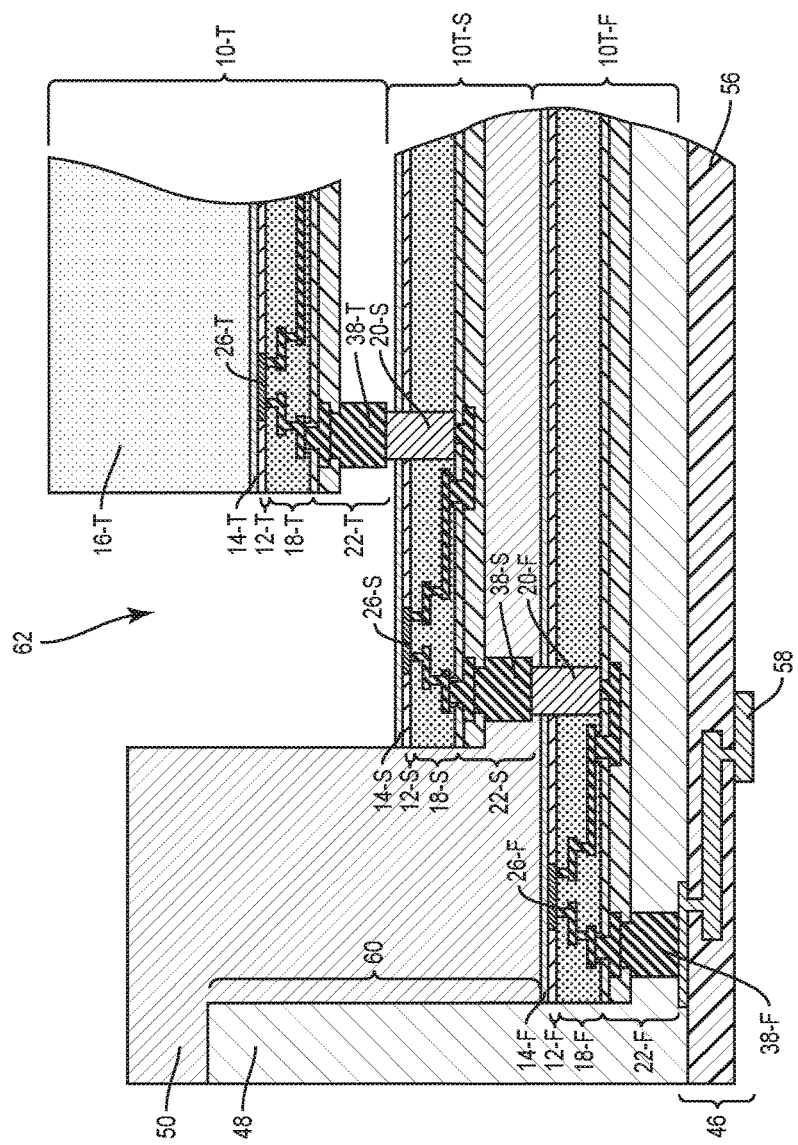

The third flip-chip die 10-T (only an edge portion of the third flip-chip die 10-T is shown) is then placed within the second opening 62 and stacked to the second thinned flip chip die 10T-S, as shown in FIG. 6I. The third flip-chip die 10-T is required to have a smaller plane size than the second thinned flip chip die 10T-S. Herein, the third flip-chip die 10-T has essentially the same configuration as the flip-chip die 10 shown in FIG. 1 (for simplification and clarity, only selective components of the third flip-chip die 10-T are labeled with reference numbers). The third flip-chip die 10-T has a same number and order of layers as the flip-chip die 10 and includes the third device layer 12-T with the third device component 26-T, the third stop layer 14-T, the third silicon handle layer 16-T, the third BEOL layer 18-T, and the third redistribution structure 22-T with the third package contact 38-T. As such, the third silicon handle layer 16-T is at the top of the third flip-chip die 10-T. The third package contact 38-T is at the bottom of the third flip-chip die 10-T, and is attached to the exposed top portion of the second through-die via 20-S. However, each layer of the third flip-chip die 10-T and the corresponding layer of the flip-chip die 10 may have a same or different number of electronic components (such as device component, inter-layer vias, redistribution interconnects, and/or package contacts). Further, the third flip-chip die 10-T is desired to have no through-die via and corresponding redistribution interconnect(s).

Figure 6J:
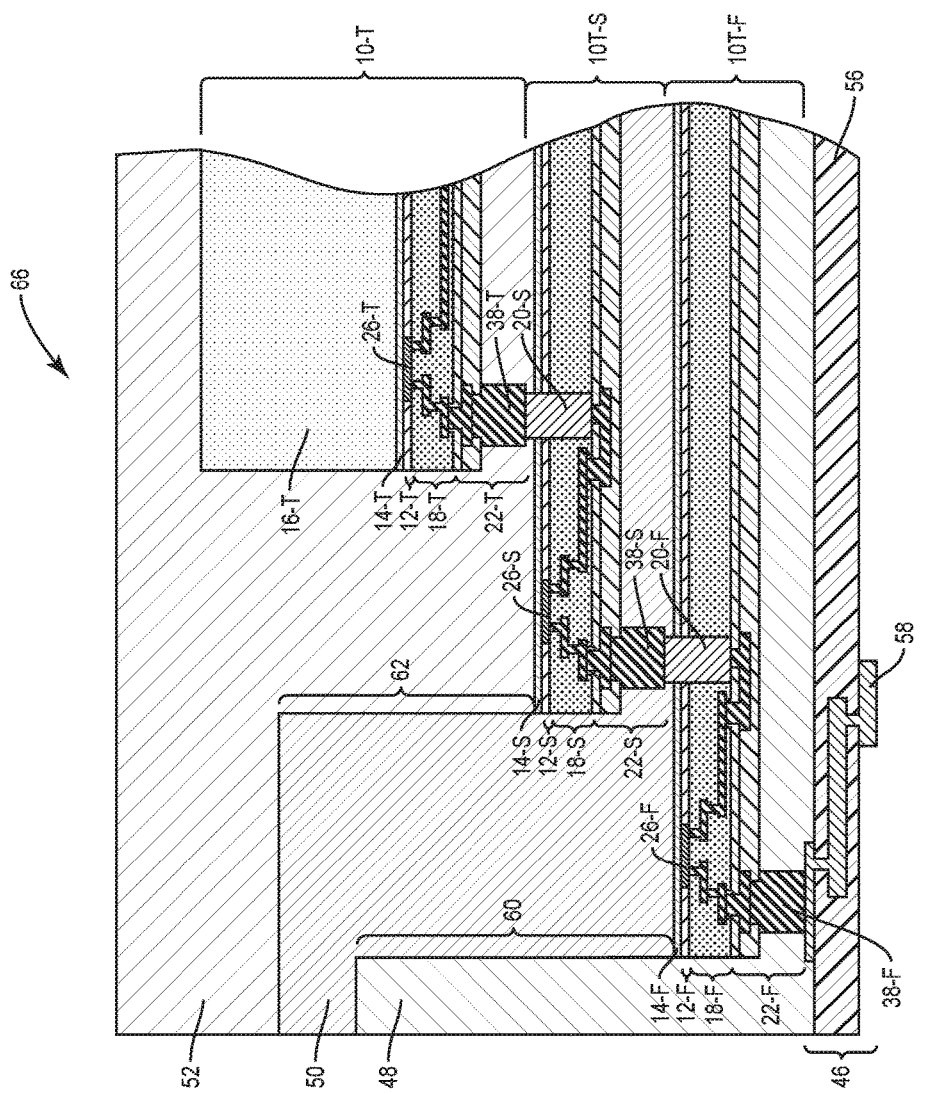

Next, the third mold compound 52 (only a portion of the third mold compound 52 is shown) is applied over the second thinned flip-chip die 10T-S as illustrated in FIG. 6J. Since the third flip-chip die 10-T has a smaller plane size than the second thinned flip chip die 10T-S, the third mold compound 52 is able to underfill the third flip-chip die 10-T between the third redistribution structure 22-T and the second thinned flip chip die 10T-S. In addition, the third mold compound 52 fully encapsulates the third flip-chip die 10-T and is directly surrounded by the second mold compound 50. The third mold compound 52 may be applied by various procedures, such as sheet molding, overmolding, compression molding, transfer molding, dam fill encapsulation, or screen print encapsulation. The third mold compound 52 may be formed of polymer materials, such as thermoset molding compounds or thermoset materials built with enhanced thermal additives. The third mold compound 52 may be used as an etchant barrier to protect the third flip-chip die 10-T against etching chemistries such as KOH, NaOH, and ACH. In one embodiment, a portion of the third mold compound 52 may reside over the upper surface of the second mold compound 50. A curing process (not shown) is followed to harden the third mold compound 52. The curing temperature is between 100° C. and 320° C. depending on which material is used as the third mold compound 52.

Figure 6K:
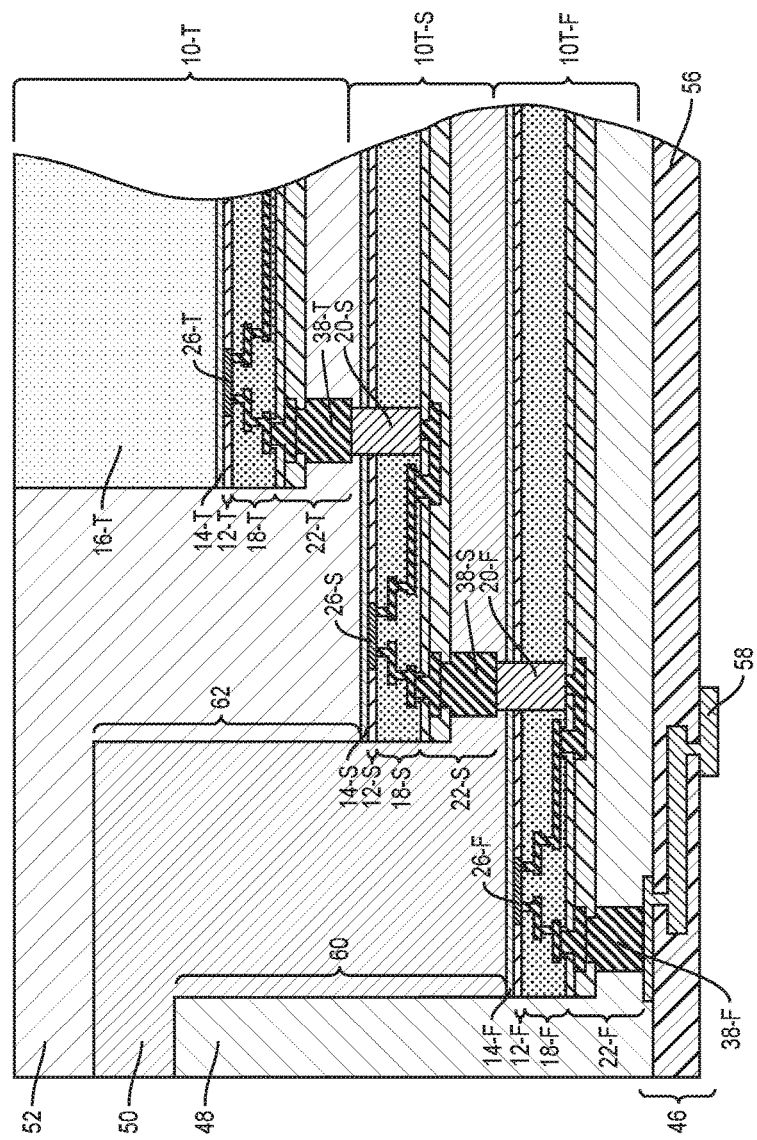
Figure 6L:
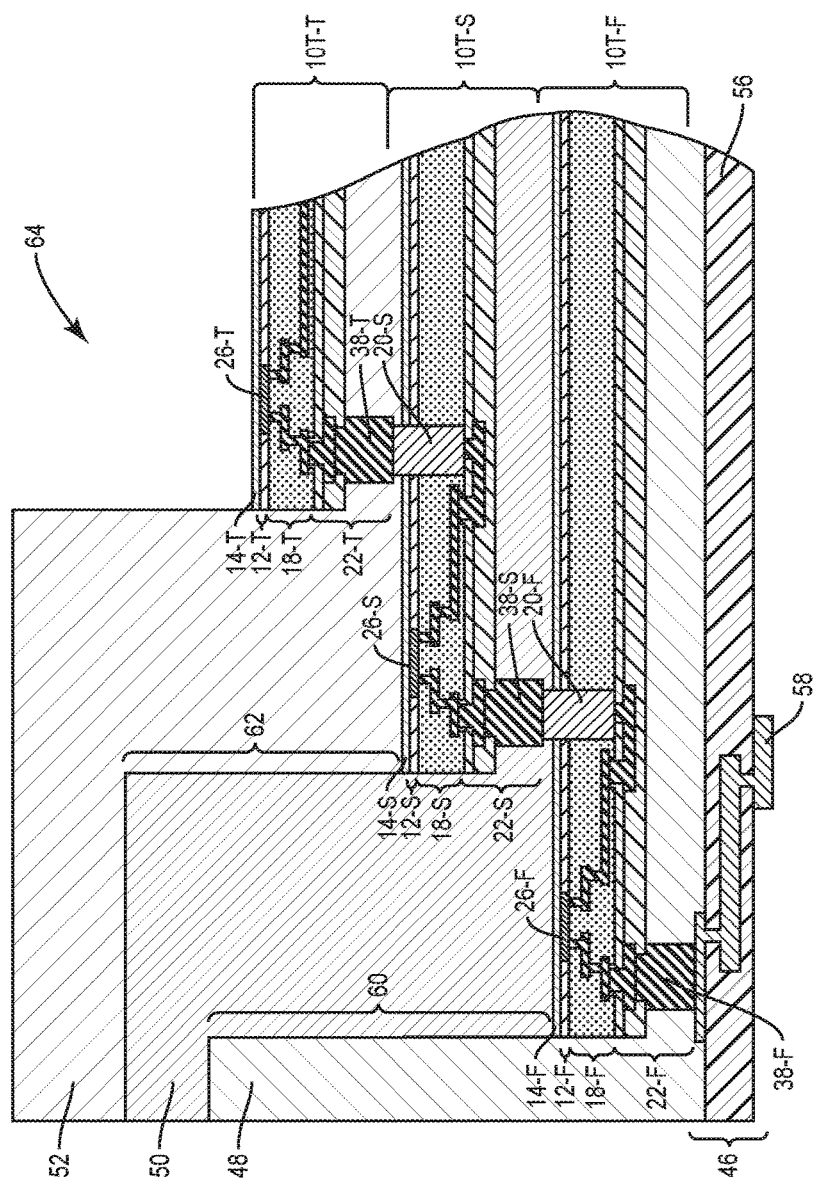

In some applications, the packaging process may end here and the alternative semiconductor package 66 is complete. In some applications, the third mold compound 52 is further thinned down to expose a backside of the third silicon handle layer 16-T, as shown in FIG. 6K. The thinning procedure may be done with a mechanical grinding process. The following step is to remove the third silicon handle layer 16-T to create the third opening 64 (only a portion of the third opening 64 is shown) and provide the third thinned flip chip die 10T-T (only an edge portion of the third thinned flip-chip die 10T-T is shown), as shown in FIG. 6L. Herein, the third stop layer 14-T is exposed at the bottom of the third opening 64. Removing the silicon handle layer 16-T of the third flip-chip die 10-T may be provided by an etching process with a wet/dry etchant chemistry, which may be TMAH, KOH, ACH, NaOH, or the like.

Figure 6M:
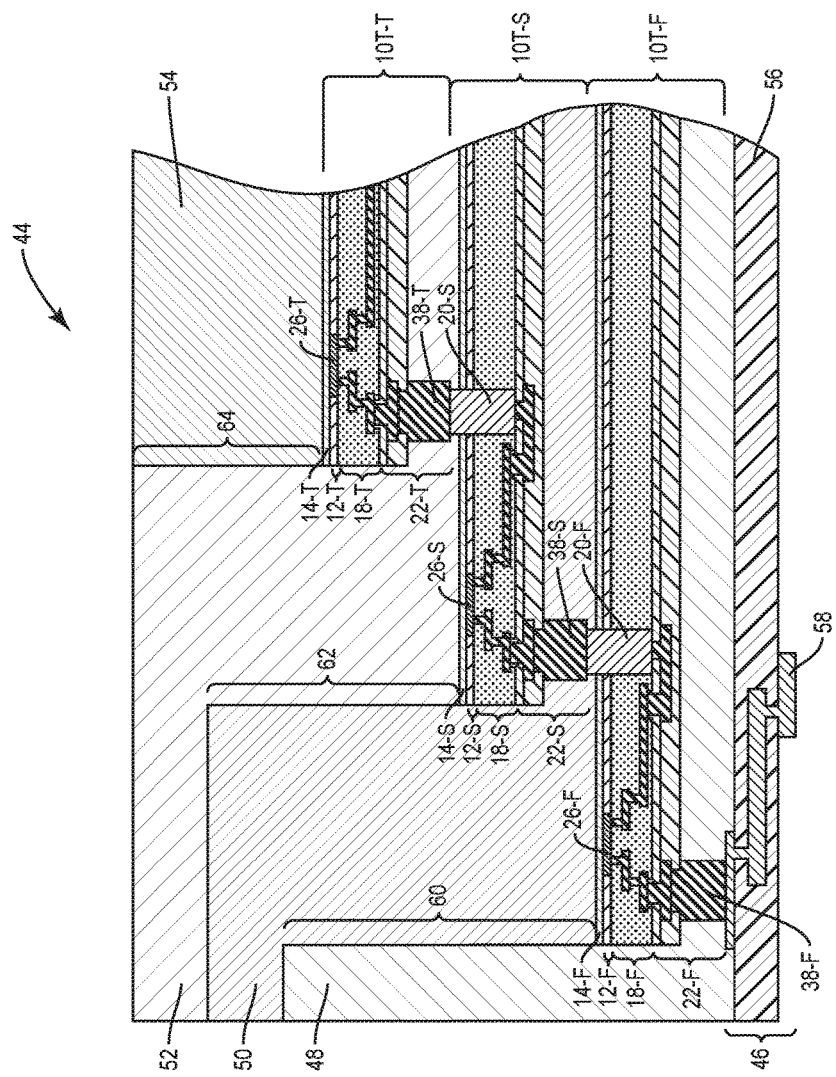

Lastly, the fourth mold compound 54 (only a portion of the fourth mold compound 54 is shown) is applied over the third thinned flip-chip die 10T-T to fill the top opening 64, as illustrated in FIG. 6M. The fourth mold compound 54 is directly surrounded by the third mold compound 52. The fourth mold compound 54 may be applied by various procedures, such as sheet molding, overmolding, compression molding, transfer molding, dam fill encapsulation, or screen print encapsulation. The fourth mold compound 54 may be formed of polymer materials, such as thermoset molding compounds or thermoset materials built with enhanced thermal additives. In some applications, a portion of the fourth mold compound 54 may reside over the upper surface of the third mold compound 52 (not shown). In some applications, the upper surface of the fourth mold compound 54 is coplanar with the upper surface of the third mold compound 52. A curing process (not shown) is followed to harden the fourth mold compound 54. The curing temperature is between 100° C. and 320° C. depending on which material is used as the fourth mold compound 54.

In one embodiment, if there is no second thinned flip-chip die 10T-S, the packaging steps shown in 6E-6H can be omitted. The third thinned flip-chip die 10T-T or the third flip-chip die 10-T may be directly stacked to the first thinned flip-chip die 10T-F. The third package contact 38-T is attached to the first through-die via 20-F of the first thinned flip-chip die 10T-F.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a module board;
   a first thinned flip-chip die comprising a first device layer, a first through-die via, and a first package contact, wherein:
      a top portion of the first through-die via is exposed at a top of the first thinned flip-chip die;
      the first package contact is exposed at a bottom of the first thinned flip-chip die, and is coupled to the module board; and
      the first device layer includes a first device component, which is electrically coupled to the first through-die via and the first package contact;
   a first mold compound residing over the module board, underfilling the first thinned flip-chip die, encapsulating sides of the first thinned flip-chip die, and extending vertically beyond the first thinned flip-chip die to define a first opening within the first mold compound and vertically above the first thinned flip chip die, wherein the first mold compound does not reside over the first thinned flip chip die; and
   a second flip-chip die stacked with the first thinned flip chip die, residing within the first opening, and over the first thinned flip chip die, wherein:
      the second flip-chip die has a smaller plane size than the first thinned flip-chip die;
      the second flip-chip die comprises a second device layer and a second package contact, which is exposed at a bottom of the second flip-chip die, and is coupled to the first through-die via; and
      the second device layer includes a second device component, which is electrically coupled to the second package contact.

2. The apparatus of claim 1 wherein the first thinned flip-chip die does not include a silicon handle layer and further includes a first stop layer, a first back-end-of-line (BEOL) layer, and a first redistribution structure with the first package contact, wherein:
   the first stop layer resides over the first device layer and is exposed at the top of the first thinned flip-chip die;
   the first BEOL layer resides underneath the first device layer;
   the first redistribution structure resides underneath the first BEOL layer and at the bottom of the first thinned flip-chip die; and
   the first through-die via extends through the first BEOL layer, the first device layer, and the first stop layer, wherein the top portion of the first through-die via extends beyond the first stop layer.

3. The apparatus of claim 1 wherein the exposed top portion of the first through-die via has a thickness between 0 and 100 μm.

4. The apparatus of claim 1 wherein the first through-die via is formed of one of a group consisting of platinum, gold, silver, copper, aluminum, tungsten, titanium, and electrically conductive epoxy.

5. The apparatus of claim 1 wherein the second flip-chip die further comprises a second stop layer, a silicon handle layer, a second BEOL layer, and a second redistribution structure with the second package contact, wherein:
   the second stop layer resides over the second device layer;
   the silicon handle layer resides over the second stop layer and at the top of the second flip-chip die;
   the second BEOL layer resides underneath the second device layer; and
   the second redistribution structure resides underneath the second BEOL layer and at the bottom of the second flip-chip die.

6. The apparatus of claim 5 further comprises a second mold compound filling the first opening, wherein:
   the second mold compound resides over the first thinned flip-chip die, such that the second mold compound encapsulates the second package contact and the exposed top portion of the first through-die via, and underfills the second flip-chip die between the second redistribution structure and the first thinned flip-chip die;
   the second mold compound is directly surrounded by the first mold compound; and
   the second mold compound fully encapsulates the second flip-chip die.

7. The apparatus of claim 6 wherein the first mold compound and the second mold compound are formed from a same material.

8. The apparatus of claim 6 wherein the first mold compound and the second mold compound have a thermal conductivity greater than 1 W/m·K, and have an electrical resistivity greater than 1E6 Ohm-cm.

9. The apparatus of claim 1 wherein the second flip-chip die is a thinned flip-chip die that does not comprise a silicon handle layer and further comprises a second stop layer, a second BEOL layer, and a second redistribution structure with the second package contact, wherein:
   the second stop layer resides over the second device layer and is exposed at a top of the second flip-chip die;
   the second BEOL layer resides underneath the second device layer; and
   the second redistribution structure resides underneath the second BEOL layer and at the bottom of the second flip-chip die.

10. The apparatus of claim 9 further comprises a second mold compound, wherein:
    the second mold compound resides over the first thinned flip-chip die, such that the second mold compound encapsulates the second package contact and the exposed top portion of the first through-die via, and underfills the second flip-chip die between the second redistribution structure and the first thinned flip-chip die;
    the second mold compound is directly surrounded by the first mold compound; and
    the second mold compound encapsulates sides of the second flip-chip die, and extends vertically beyond the second flip-chip die to define a second opening within the second mold compound and vertically above the second flip chip die, wherein the second mold compound does not reside over the second flip chip die.

11. The apparatus of claim 10 further comprises a third mold compound, which resides over the second flip-chip die, fills the second opening, and is directly surrounded by the second mold compound.

12. The apparatus of claim 11 wherein the first mold compound, the second mold compound, and the third mold compound are formed from a same material.

13. The apparatus of claim 9 wherein the second flip-chip die further comprises a second through-die via that extends through the second BEOL layer, the second device layer, and the second stop layer, wherein a top portion of the second through-die via extends beyond the second stop layer and is exposed at the top of the second flip-chip die.

14. The apparatus of claim 13 further comprises a second mold compound, wherein:
the second mold compound resides over the first thinned flip-chip die, such that the second mold compound encapsulates the second package contact and the exposed top portion of the first through-die via, and underfills the second flip-chip die between the second redistribution structure and the first thinned flip-chip die;
the second mold compound is directly surrounded by the first mold compound; and
the second mold compound encapsulates sides of the second flip-chip die, and extends vertically beyond the second flip-chip die to define a second opening within the second mold compound and vertically above the second flip chip die, wherein the second mold compound does not reside over the second flip chip die.

15. The apparatus of claim 14 further comprises a third flip-chip die stacked with the second flip chip die, residing within the second opening, and over the second flip chip die, wherein:
the third flip-chip die has a smaller plane size than the second flip-chip die;
the third flip-chip die comprises a third device layer and a third package contact, which is exposed at a bottom of the third flip-chip die, and is coupled to the second through-die via; and
the third device layer includes a third device component, which is electrically coupled to the third package contact.

16. The apparatus of claim 15 wherein the third flip-chip die further comprises a third stop layer, a silicon handle layer, a third BEOL layer, and a third redistribution structure with the third package contact, wherein:
the third stop layer resides over the third device layer;
the silicon handle layer resides over the third stop layer and at a top of the third flip-chip die;
the third BEOL layer resides underneath the third device layer; and
the third redistribution structure resides underneath the third BEOL layer and at the bottom of the third flip-chip die.

17. The apparatus of claim 16 further comprises a third mold compound filling the second opening, wherein:
the third mold compound resides over the second flip-chip die, such that the third mold compound encapsulates the third package contact and the exposed top portion of the second through-die via, and underfills the third flip-chip die between the third redistribution structure and the second flip-chip die;
the third mold compound is directly surrounded by the second mold compound; and
the third mold compound fully encapsulates the third flip-chip die.

18. The apparatus of claim 17 wherein the first mold compound, the second mold compound, and the third mold compound are formed from a same material.

19. The apparatus of claim 15 wherein the third flip-chip die is a thinned flip-chip die that does not comprise a silicon handle layer and further comprises a third stop layer, a third BEOL layer, and a third redistribution structure with the third package contact, wherein:
the third stop layer resides over the third device layer and is exposed at a top of the third flip-chip die;
the third BEOL layer resides underneath the third device layer; and
the third redistribution structure resides underneath the third BEOL layer and at the bottom of the third flip-chip die.

20. The apparatus of claim 19 further comprises a third mold compound, wherein:
the third mold compound resides over the second flip-chip die, such that the third mold compound encapsulates the third package contact and the exposed top portion of the second through-die via, and underfills the third flip-chip die between the third redistribution structure and the second flip-chip die;
the third mold compound is directly surrounded by the second mold compound; and
the third mold compound encapsulates sides of the third flip-chip die, and extends vertically beyond the third flip-chip die to define a third opening within the third mold compound and vertically above the third flip chip die, wherein the third mold compound does not reside over the third flip chip die.

21. The apparatus of claim 20 further comprises a fourth mold compound, which resides over the third flip-chip die, fills the third opening, and is directly surrounded by the third mold compound.

22. The apparatus of claim 21 wherein the first mold compound, the second mold compound, the third mold compound, and the fourth mold compound are formed from a same material.

* * * * *